United States Patent
Lim et al.

(10) Patent No.: US 8,482,051 B2
(45) Date of Patent: Jul. 9, 2013

(54) 3D NONVOLATILE MEMORY DEVICE INCLUDING A PLURALITY OF CHANNEL CONTACTS COUPLED TO A PLURALITY OF CHANNEL LAYERS AND A PLURALITY OF SECTION LINES COUPLED TO THE PLURALITY OF CHANNEL CONTACTS AND METHOD FOR FABRICATING THE SAME

(75) Inventors: Se-Yun Lim, Gyeonggi-do (KR); Eun-Seok Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 227 days.

(21) Appl. No.: 12/974,397

(22) Filed: Dec. 21, 2010

(65) Prior Publication Data

US 2011/0169072 A1 Jul. 14, 2011

(30) Foreign Application Priority Data

Jan. 11, 2010 (KR) .................. 10-2010-0002254
May 3, 2010 (KR) .................. 10-2010-0041448

(51) Int. Cl.
*H01L 29/78* (2006.01)

(52) U.S. Cl.
USPC .................. 257/315; 257/E29.3; 365/185.29

(58) Field of Classification Search
USPC ................. 257/315, 319, E29.3; 365/185.17, 365/185.29
See application file for complete search history.

(56) References Cited

U.S. PATENT DOCUMENTS

| 2009/0242967 A1* | 10/2009 | Katsumata et al. | ............ 257/324 |
| 2009/0310425 A1* | 12/2009 | Sim et al. | ................. 365/185.29 |
| 2011/0059595 A1* | 3/2011 | Jung | ............................ 438/430 |

FOREIGN PATENT DOCUMENTS

| KR | 1020080012667 | 2/2008 |
| KR | 100855990 | 9/2008 |
| KR | 1020110001487 | 1/2011 |
| KR | 1020110026277 | 3/2011 |

OTHER PUBLICATIONS

Notice of Allowance issued from Korean Intellectual Property Office on Sep. 27, 2011.
Notice of Preliminary Rejection issued from Korean Intellectual Property Office on Apr. 14, 2011.

* cited by examiner

*Primary Examiner* — Thomas L Dickey
(74) *Attorney, Agent, or Firm* — IP & T Group LLP

(57) ABSTRACT

A 3D nonvolatile memory device includes a plurality of channel structures each comprising a plurality of channel layers and interlayer dielectric layers which are alternately stacked, a plurality of channel contacts coupled to the plurality of channel layers, respectively, and a plurality of selection lines vertically-coupled to the plurality of channel contacts and crossing over the plurality of channel structures.

19 Claims, 26 Drawing Sheets

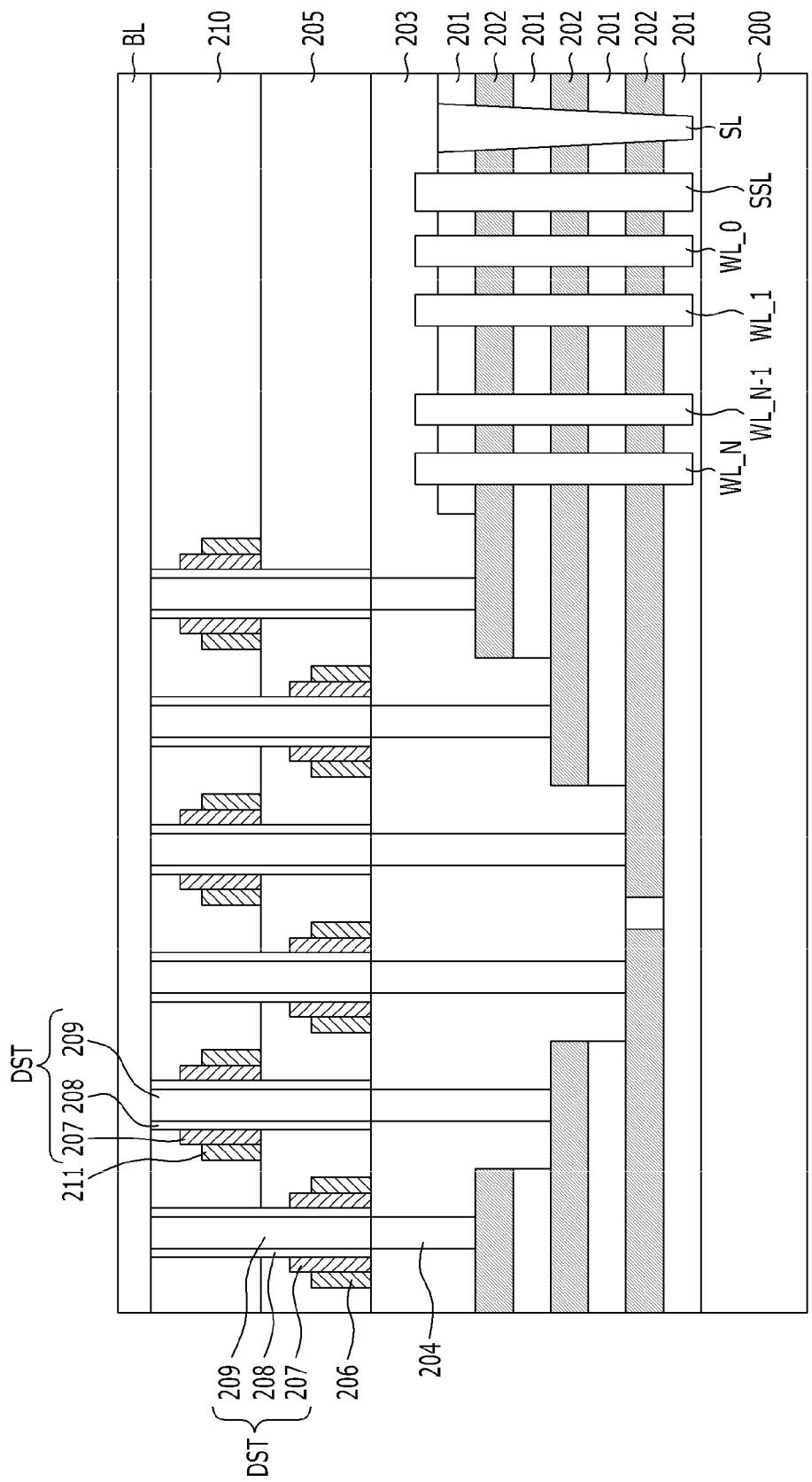

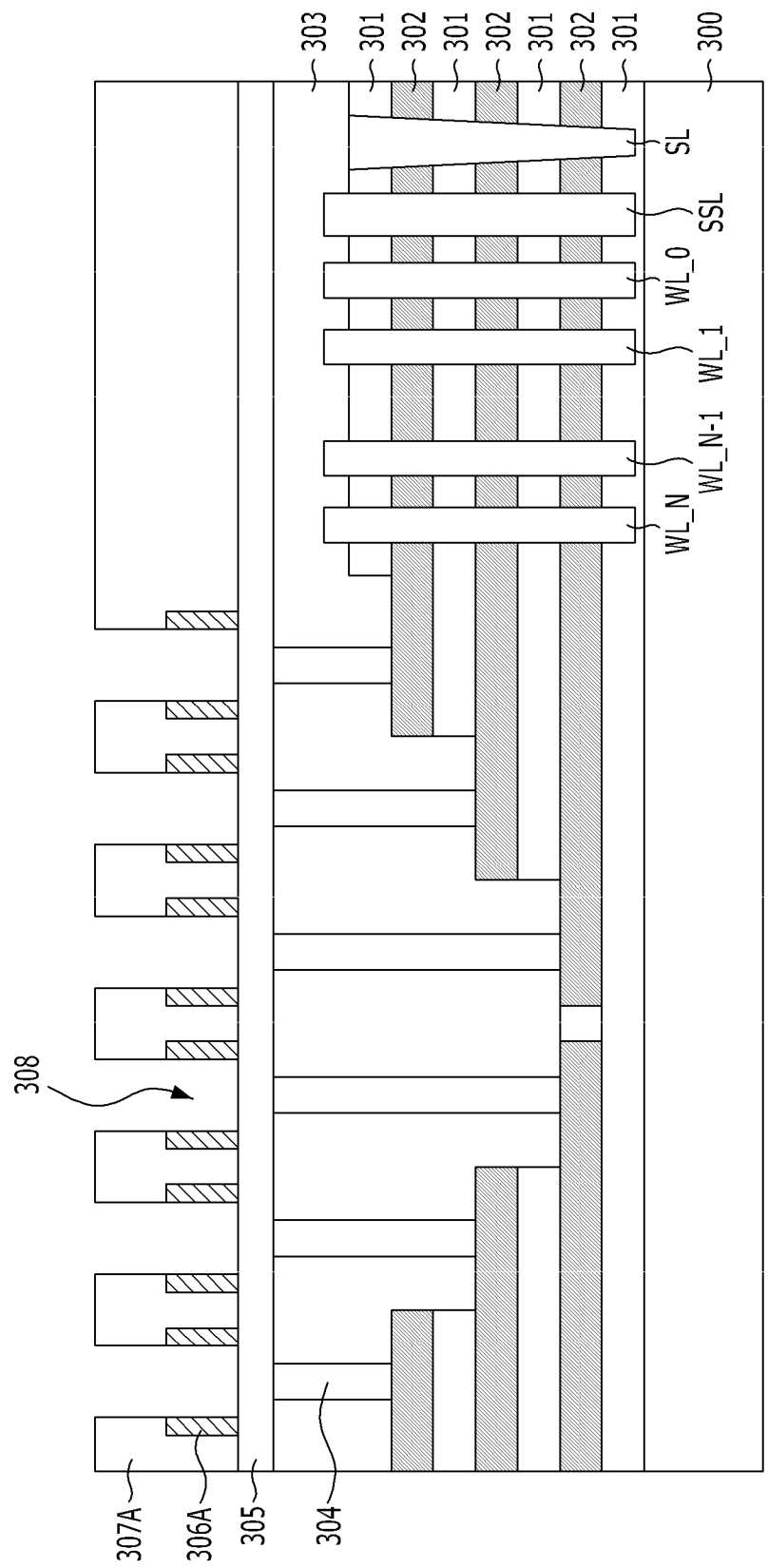

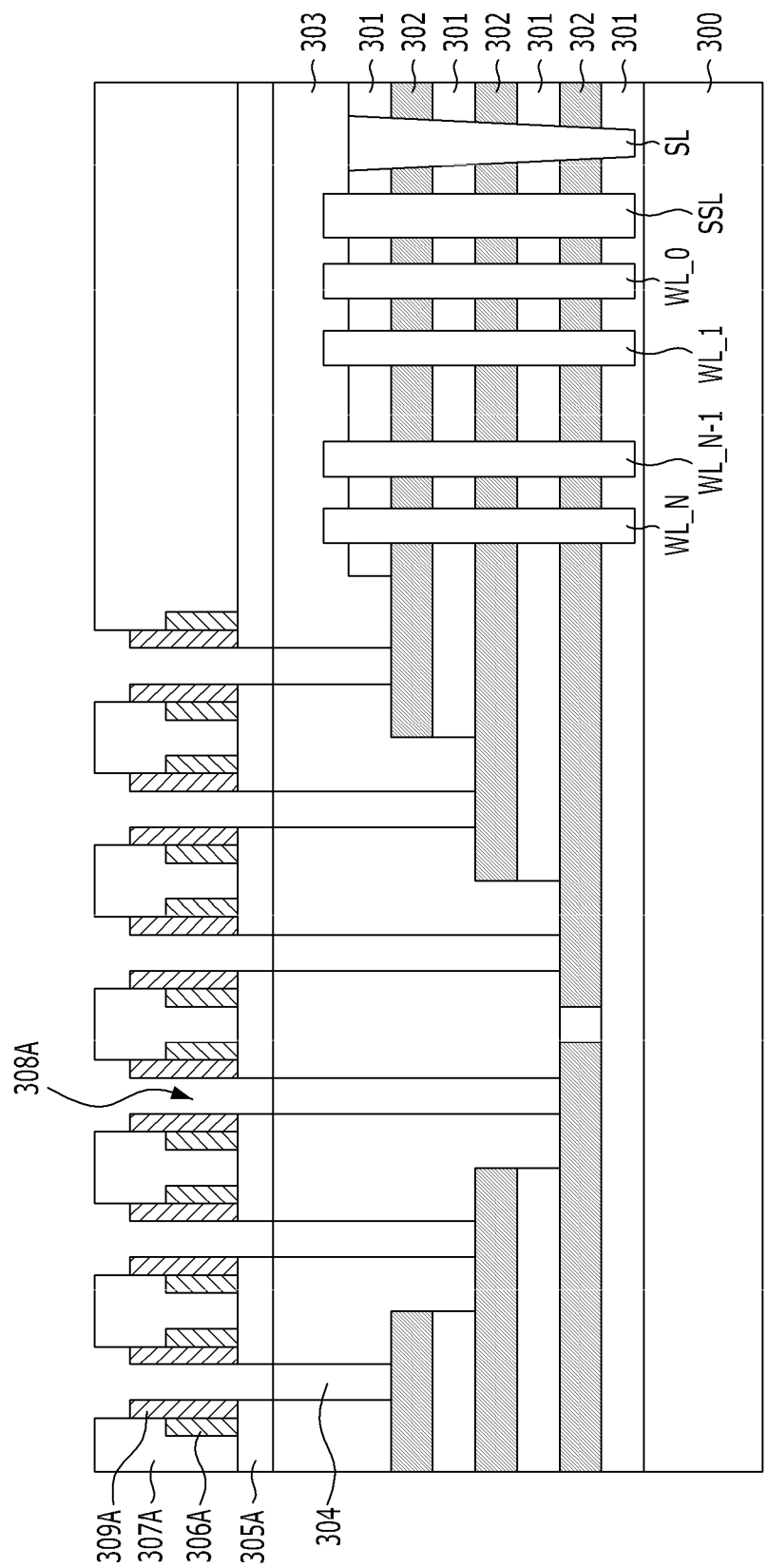

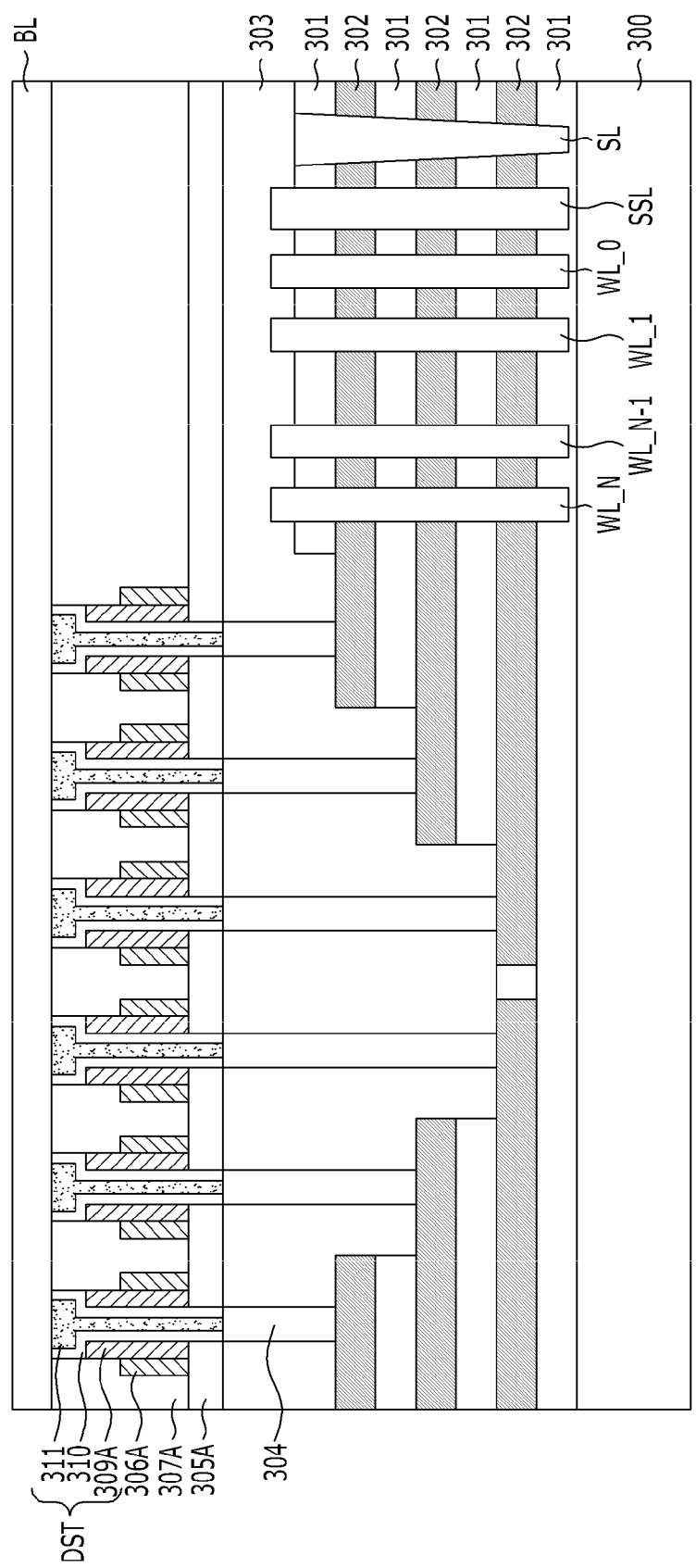

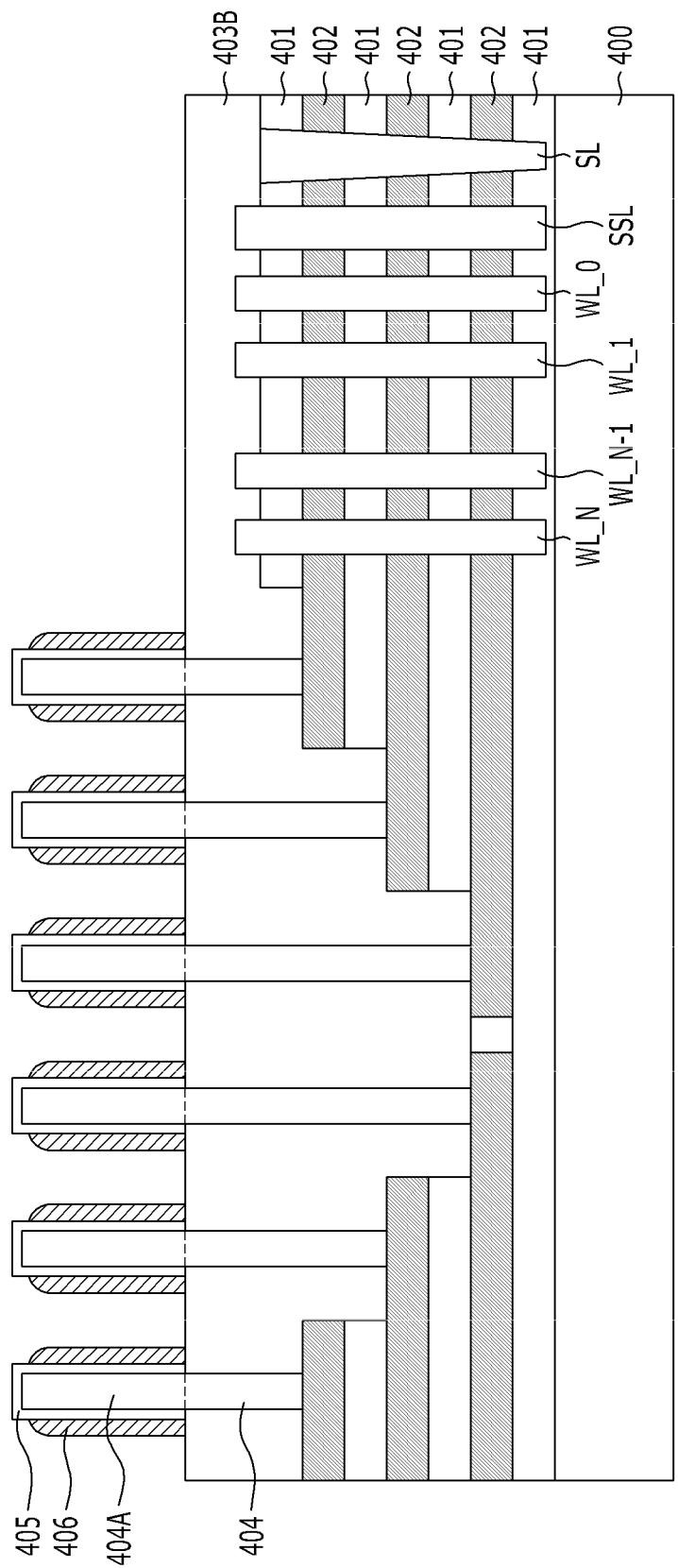

3D NONVOLATILE MEMORY DEVICE INCLUDING A PLURALITY OF CHANNEL CONTACTS COUPLED TO A PLURALITY OF CHANNEL LAYERS AND A PLURALITY OF SECTION LINES COUPLED TO THE PLURALITY OF CHANNEL CONTACTS AND METHOD FOR FABRICATING THE SAME

CROSS-REFERENCES TO RELATED APPLICATIONS

The present application claims priority of Korean Patent Application Nos. 10-2010-0002254 and 10-2010-0041448, filed on Jan. 11, 2010, and May 3, 2010, respectively, which are incorporated herein by reference in their entirety.

BACKGROUND OF THE INVENTION

Exemplary embodiments of the present invention relate to semiconductor device fabrication technology, and more particularly, to a 3-dimensional (3D) nonvolatile memory device and a method for fabricating the same.

A non-volatile memory device refers to a memory device which maintains data stored therein even though power supply is cut off. As an increase in integration degree of 2-dimensional (2D) memory devices, in which memory cells are formed as a single layer on a substrate, approaches the limit, 3D nonvolatile memory devices in which memory cells are vertically stacked on a substrate have been proposed.

FIGS. 1A and 1B are perspective view of a conventional 3D nonvolatile memory device.

Referring to FIG. 1A, the conventional 3D nonvolatile memory device includes a plurality of channel structures C extending in parallel to each other and in a first direction I-I', a plurality of memory cells MC stacked along a sidewall of the channel structure C, and a word line WL coupled to gate electrodes of the memory cells MC arranged in a second direction II-II'.

The channel structure C includes a plurality of interlayer dielectric layers 11 and channel layers 12 which are alternately stacked on a substrate 10, and the plurality of memory cells MC are stacked along the sidewall of the channel structure C. Each memory cell MC includes a memory layer 13 and a gate electrode 14 which are sequentially stacked on the channel layer 12. At this time, the memory layer 13 includes a tunnel insulation layer 13A, a charge trap layer 13B, and a charge block layer 13C which are sequentially stacked.

Referring to FIG. 1B, the conventional 3D nonvolatile memory device includes a plurality of drain selection lines DSL_0 to DSL_X, a plurality of drain contact plugs DCT_0 to DCT_X, and a plurality of bit lines BL. Hereafter, a conventional method for forming the drain selection lines DSL_0 to DSL_X, the drain contact plugs DCT_0 to DCT_X, and the bit lines BL is described.

First, a drain selection transistor region of the channel structure C is etched in a stepped shape to expose the plurality of channel layers 12, and gate dielectric layers 15 are formed on the exposed channel layers 12. Conductive layers for a gate electrode are formed on the gate dielectric layers 15, respectively, to form a plurality of drain selection transistors, and the plurality of drain selection lines DSL_0 to DSL_X are formed to couple the drain selection transistors arranged in the second direction, while extending in parallel to each other and in the second direction.

Accordingly, the flat drain selection transistors are formed on the plurality of channel layers 12, respectively. The drain selection transistors which are formed on the channel layers 12 at the same step level and arranged in the second direction are coupled by any one of the drain selection lines DSL_0 to DSL_X.

An insulation layer which is not illustrated in FIG. 1B is formed on the entire surface of the resultant structure, and a plurality of drain contact holes are formed to expose the surfaces of the respective channel layers 12. A conductive layer is buried in the drain contact holes to form the drain contact plugs DCT_0 to DCT_X coupled to the plurality of channel layers 12, respectively. The plurality of bit lines BL are formed to extend in parallel to each other and in the first direction, while coupled to the drain contact plugs DCT_0 to DCT_X.

In accordance with the conventional method, the channel structure C is patterned in a stepped shape to expose the plurality of channel layers 12, and the flat drain selection transistors are formed on the exposed channel layers 12, respectively. Therefore, a considerably large area is occupied for forming the flat drain selection transistors. Accordingly, although the number of channel layers 12 to be stacked is increased, there is a limitation in increasing the integration degree of the memory device, because the area for the drain selection transistors is accordingly increased. Furthermore, when the flat drain selection transistors are formed, it is highly likely that leakage current occurs. Therefore, the property of the memory device is degraded.

In accordance with the conventional method, the drain selection lines DSL_0 to DSL_X are arranged as plural layers. Therefore, during the fabrication process, a plurality of masks are to be used. Accordingly, a fabricating cost may increase, and there may be technical difficulties in patterning the respective drain selection lines DSL_0 to DSL_X.

Furthermore, the drain selection lines DSL_0 to DSL_X are used as the gate electrodes of the drain selection transistors, and formed of a polysilicon layer in consideration of a junction property with the gate dielectric layers 15. Here, in order to improve a signal transmission property of the memory device, the resistance of the drain selection lines DSL_0 to DSL_X is to be reduced. However, there is a limitation in reducing the resistance of the drain selection lines DSL_0 to DSL_X formed of a polysilicon layer. For reference, when the drain selection lines DSL_0 to DSL_X are formed of a low-resistance metallic layer such as a metal layer or a metal silicide layer in order to reduce its resistance, the drain selection lines DSL_0 to DSL_X are directly in contact with the gate dielectric layers 15 of the drain selection transistors, which may cause a malfunction of the drain selection transistors.

SUMMARY OF THE INVENTION

Exemplary embodiments of the present invention are directed to a 3D nonvolatile memory device, which includes a plurality of channel contacts coupled to a plurality of channel layers and a plurality of selection lines coupled to the plurality of channel contacts, and a method for fabricating the same.

Exemplary embodiments of the present invention are also directed to a 3D nonvolatile memory device and a method for fabricating the same, which is capable of reducing an area of a selection transistor.

Exemplary embodiments of the present invention are also directed to a 3D nonvolatile memory device, which includes a selection transistor capable of suppressing the occurrence of leakage current, and a method for fabricating the same.

Exemplary embodiments of the present invention are also directed to a 3D nonvolatile memory device, which is capable of reducing the resistance of a selection line and substantially preventing a malfunction of a selection transistor coupled to the selection line and a method for fabricating the same.

In accordance with an exemplary embodiment of the present invention, a 3D nonvolatile memory device includes: a plurality of channel structures each including a plurality of channel layers and interlayer dielectric layers which are alternately stacked; a plurality of channel contacts coupled to the plurality of channel layers, respectively; and a plurality of selection lines vertically-coupled to the plurality of channel contacts and crossing over the plurality of channel structures.

In accordance with another exemplary embodiment of the present invention, a method for fabricating a 3D nonvolatile memory device includes: forming a plurality of channel structures each in including a plurality of channel layers and interlayer dielectric layers which are alternately stacked; forming a plurality of channel contacts coupled to the plurality of channel layers, respectively; and forming a plurality of selection lines vertically-coupled to the plurality of channel contacts and crossing over the plurality of channel structures.

In accordance with yet another exemplary embodiment of the present invention, a method for fabricating a 3D nonvolatile memory device includes: forming a channel structure comprising a plurality of channel layers and interlayer dielectric layers, which are alternately stacked, and a first interlayer dielectric layer covering the channel structure; forming a plurality of channel contacts passing through the first interlayer dielectric layer and coupled to the plurality of channel layers, respectively; and forming a plurality of selection lines covering the channel contacts and including a low-resistance material and a plurality of selection transistors buried in the selection lines and coupled to the channel contacts.

BRIEF DESCRIPTION OF THE DRAWINGS

FIG. 9B is a cross-sectional view of a 3D nonvolatile memory device having drain selection lines and drain selection transistors in accordance with another exemplary embodiment of the present invention.

FIGS. 10A to 10F are cross-sectional views illustrating a method for fabricating a 3D nonvolatile memory device in accordance with another exemplary embodiment of the present invention.

FIGS. 11A to 11E are cross-sectional views illustrating a method for fabricating a 3D nonvolatile memory device in accordance with another exemplary embodiment of the present invention.

DESCRIPTION OF SPECIFIC EMBODIMENTS

Figure 1A:
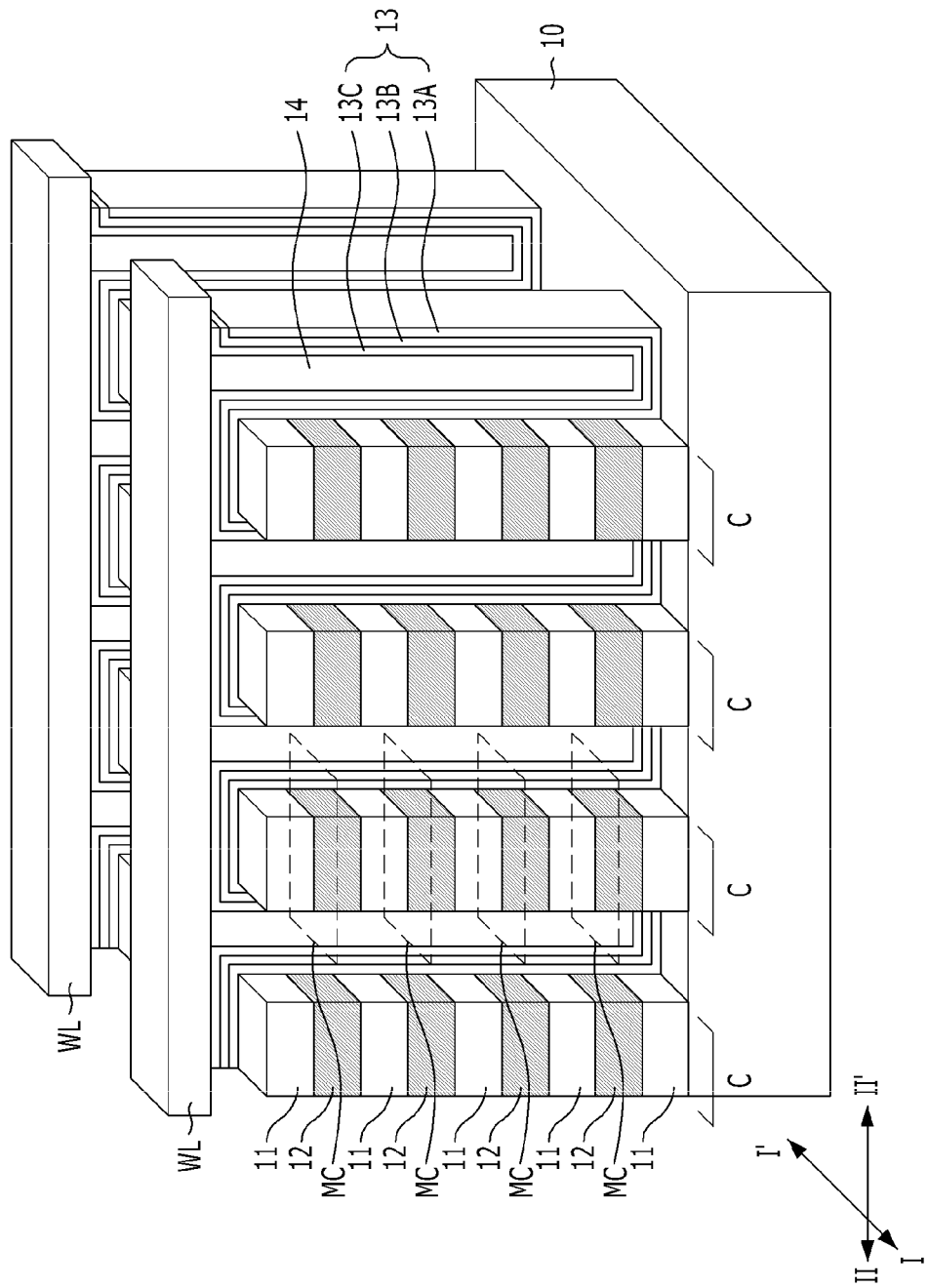
FIGS. 1A and 1B are perspective views of a conventional 3D nonvolatile memory device.
Figure 1B:
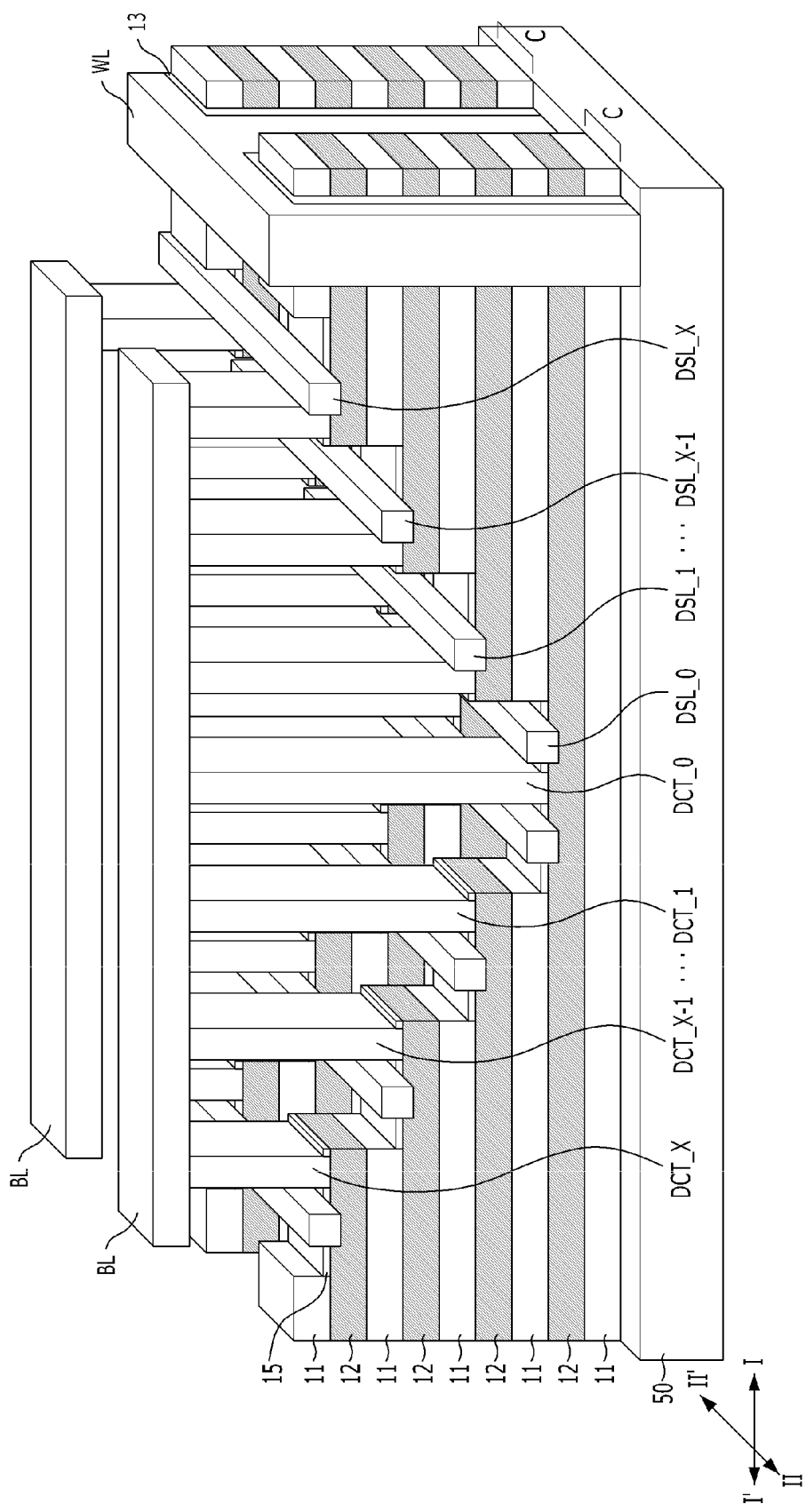

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Exemplary embodiments of the present invention provide a 3D nonvolatile memory device and a method for fabricating the same, which is capable of reducing an area of a selection transistor, suppressing the occurrence of leakage current in the selection transistor, reducing the resistance of a selection line, and substantially preventing a malfunction of the selection transistor coupled to the selection line.

The 3D nonvolatile memory device according to the exemplary embodiments of the present invention is characterized in that the selection transistor is formed to have a gate all around (GAA) in order to reduce its area and suppress the occurrence of leakage current therein. Furthermore, the 3D nonvolatile memory device is characterized in that the selection line is formed of a low-resistance metallic layer in order to reduce its resistance. Furthermore, the 3D nonvolatile memory device is characterized in that a gate electrode formed of a silicon layer is inserted between the selection line and a gate dielectric layer of the selection transistor to substantially prevent a direct contact between the selection line and the gate dielectric layer, thereby substantially preventing a malfunction of the selection transistor which may occur when the selection line is formed of a low-resistance metallic layer.

Hereafter, exemplary embodiments of the present invention will be described in more detail.

Figure 2A:
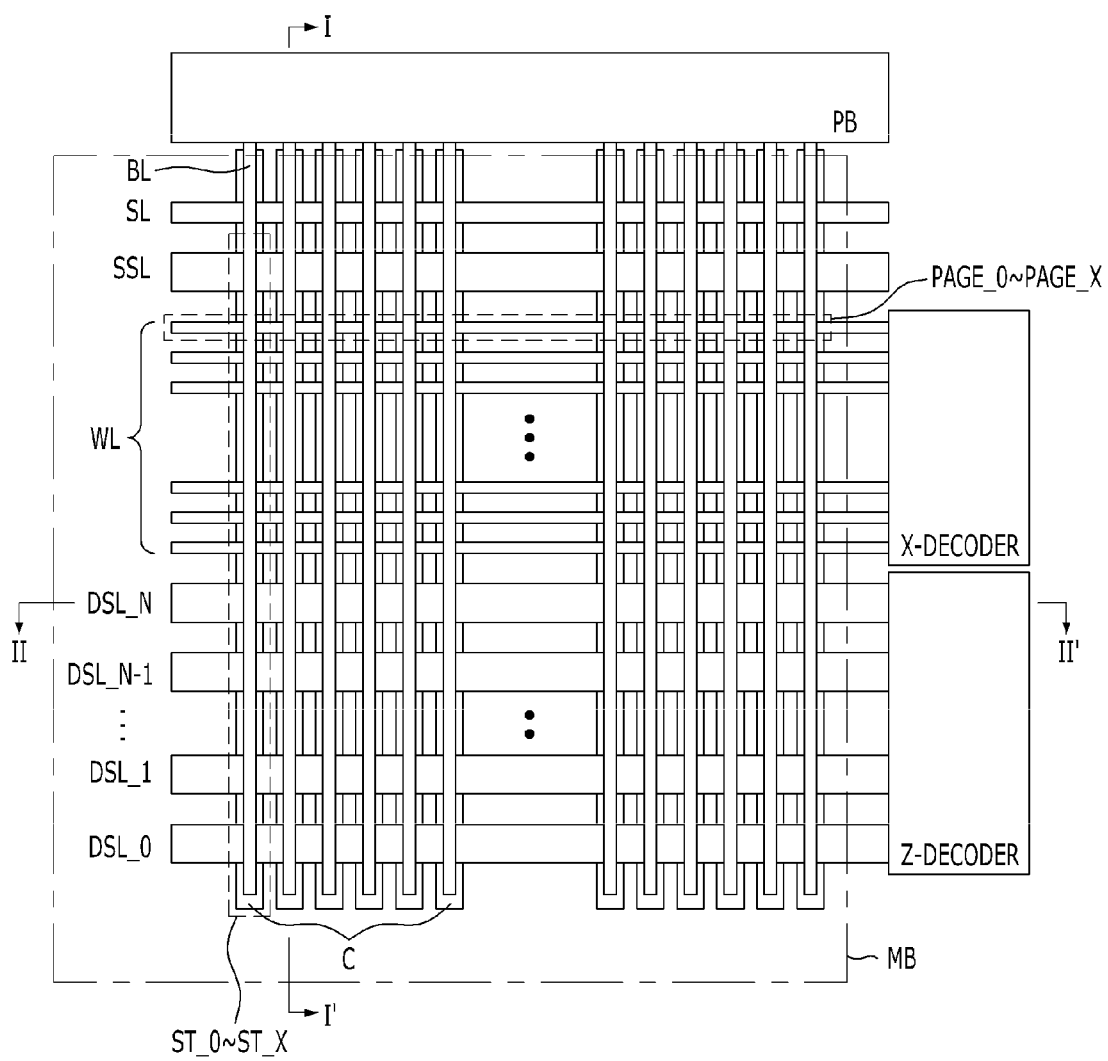
FIG. 2A is a diagram illustrating the layout of a 3D nonvolatile memory device in accordance with an exemplary embodiment of the present invention.

FIG. 2A is a diagram illustrating the layout of a 3D nonvolatile memory device in accordance with an exemplary embodiment of the present invention.

Referring to FIG. 2A, a plurality of bit lines BL and a plurality of word lines are provided on a substrate. The plurality of bit lines BL extend in parallel to each other and in a first direction I-I', and the plurality of word lines WL extend in parallel to each other and in a second direction II-II'.

The bit line BL serves to input/output data. Although not illustrated in FIG. 2A, a plurality of strings ST_0 to ST_X are stacked and coupled to one bit line BL. Furthermore, the plurality of strings ST, coupled to the plurality of bit lines BL, are coupled in parallel to a source line SL and form a memory block.

The word line WL serves to select and enable a memory cell. Although not illustrated in FIG. 2A, a plurality of pages PAGE_0 to PAGE_X are stacked and coupled to one word line WL. Furthermore, a desired page is selected by a plurality of drain selection lines DSL_0 to DSL_N coupled to a plurality of channel layers, respectively, through a plurality of channel contacts.

Furthermore, a plurality of source selection lines SSL are provided on the substrate so as to extend in parallel to each other and in the second direction, and the source line SL is provided in a junction area between the source selection lines SSL.

The drain selection lines DSL_0 to DSL_N are provided on the substrate so as to extend in parallel to each other and in the second direction. In accordance with an exemplary embodiment of the present invention, the plurality of channel contacts coupled to the respective channel layers are provided, and the channel layers are coupled to the drain selection lines DSL_0 to DSL_N through the channel contacts.

FIG. 2A shows an exemplary case in which the plurality of drain selection lines DSL_0 to DSL_N are provided for the respective channel layers. For example, one drain selection line DSL may be coupled to a plurality of channel contacts. That is, one drain selection line DSL may be coupled to a plurality of channel layers through a plurality of channel contacts.

The plurality of drain selection lines DSL_0 to DSL_N are coupled to a Z-decoder 7-DECODER, and the 7-decoder decodes an inputted address to control a corresponding drain selection line DSL.

Figure 2B:
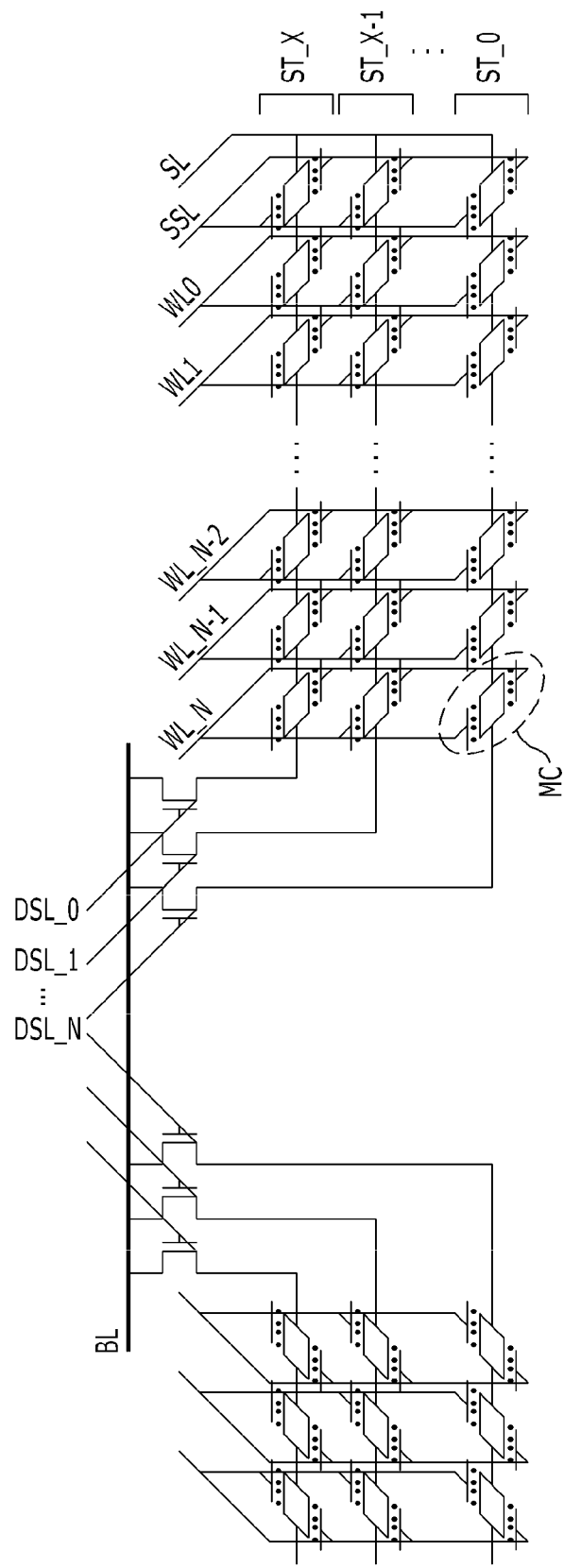
FIG. 2B is a circuit diagram illustrating a part of a cell array of to the 3-D nonvolatile memory device in accordance with an exemplary embodiment of the present invention.

FIG. 2B is a circuit diagram illustrating a part of a cell array of the 3-D nonvolatile memory device in accordance with an exemplary embodiment of the present invention. For convenience of explanation, FIG. 2B focuses on the plurality of strings ST coupled to one bit line BL.

Referring to FIG. 2B, the plurality of strings ST_0 to ST_X are coupled to one bit line BL. Furthermore, the plurality of strings ST_0 to ST_X are coupled to the plurality of drain selection lines DSL_0 to DSL_N through the plurality of channel contacts, respectively.

Therefore, during a read/write operation, a desired page PAGE may be selected by enabling a drain selection line DSL coupled to the desired page PAGE and disabling the other drain selection lines DSL.

The memory cell MC has a dual gate structure in which gate electrodes are provided on both sidewalls of the channel structure C.

Figure 2C:
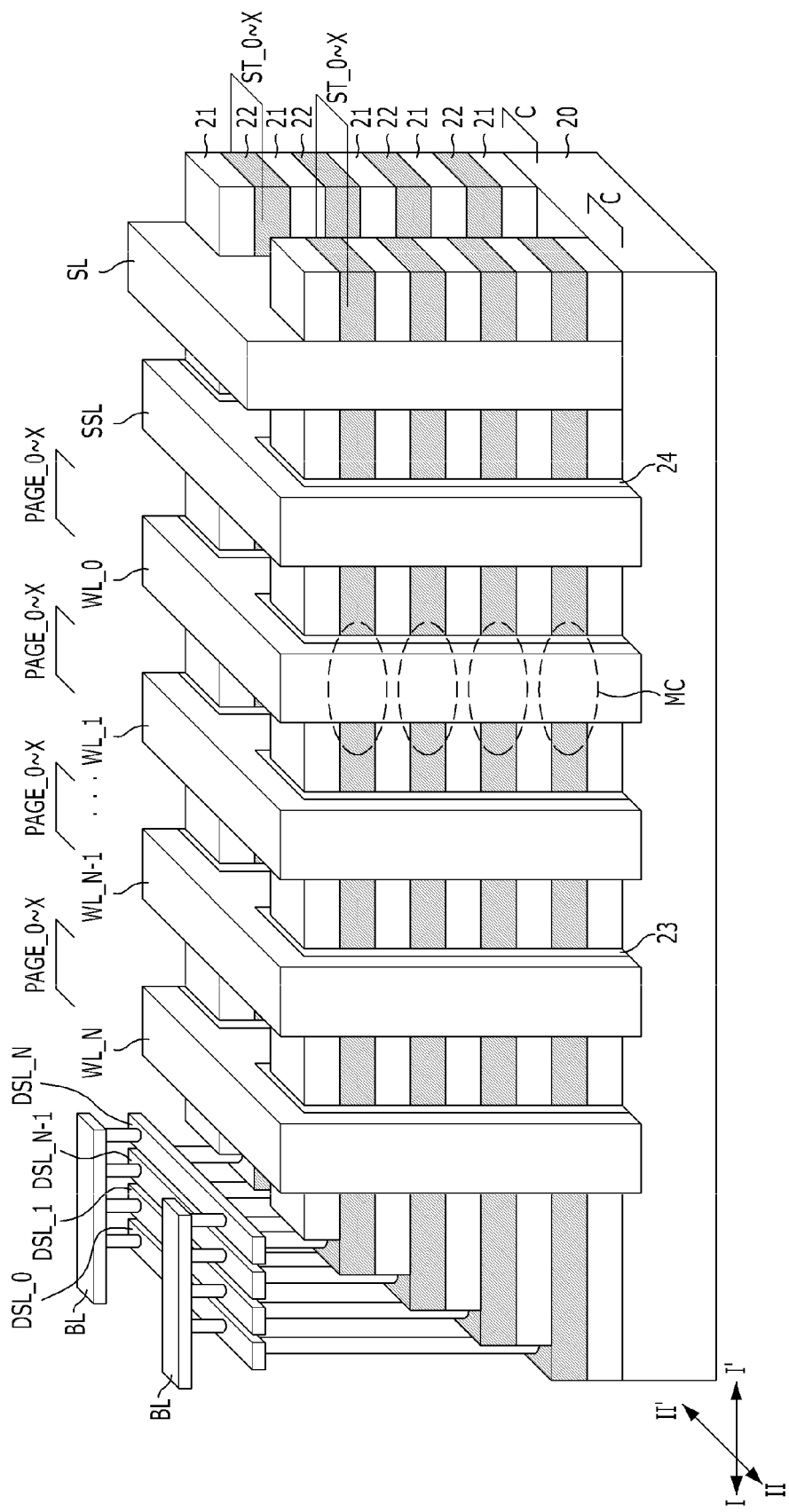
FIG. 2C is a perspective view of the 3D nonvolatile memory device in accordance with an exemplary embodiment of the present invention.

FIG. 2C is a perspective view of the 3D nonvolatile memory device in accordance with an exemplary embodiment of the present invention.

Referring to FIG. 2C, the 3D nonvolatile memory device includes a plurality of channel structures C extending in parallel to each other and in the first direction a plurality of memory cells MC stacked along sidewalls of the channel structures C, and the plurality of bit lines BL extending in parallel to each other and in the first direction I-I'.

Each of the channel structures C includes a plurality of channel is layers 22 and interlayer dielectric layers 21 which are alternately stacked on the substrate 20. The number of strings ST sharing a bit line BL depends on the number of channel layers 22 to be stacked.

One end of the channel structure C may be patterned in such a manner that the plurality of channel layers 22 are exposed to form the plurality of channel contacts coupled to the plurality of channel layers 22, respectively. FIG. 2C illustrates a case in which the end of the channel structure C is patterned in a stepped shape.

The plurality of memory cells MC are interposed between the word lines WL_0 to WL_N and the channel layers 22, and include a memory layer 23 having a multilayer structure in which a tunnel insulation layer, a charge trap layer, and a charge blocking layer are stacked. The plurality of memory cells MC are stacked along the sidewalls of the channel structure C and arranged in the first and second directions. Here, a plurality of memory cells MC, which are arranged in the first direction to share one channel layer 22 at the same layer, are coupled in series between a source selection transistor and a drain selection transistor to form a string structure.

The 3D nonvolatile memory device in accordance with an exemplary embodiment of the present invention includes a plurality of word lines WL_0 to WL_N extending in parallel to each other and in the second direction II-II', a source selection line SSL, and a source line SL.

Among a plurality of memory cells MC sharing one word line WL, memory cells MC formed at the same layer compose one page PAGE. That is, one word line WL is coupled to a plurality of pages PAGE_0 to PAGE_X. During a read/write operation, a desired page may be selected by turning on/off drain selection lines DSL_0 to DLS_X.

Although memory cells are formed at the same layer, the memory cells may be assigned to a page depending on their corresponding bit lines. That is, a page PAGE coupled to an even bit line BL may operate as an even page, and a page PAGE coupled to an odd bit line BL may operate as an odd page. For convenience of explanation, the even page and the odd page are not discriminated from each other in this specification.

The source selection line SSL may be formed together when the memory cells MC and the word lines WL_0 and WL_N are formed. Between the source selection line SSL and the channel layer 22, a gate dielectric layer 24 is interposed.

The source line SL may be formed as follows: a trench is formed by etching a source line formation region between the source selection lines SSL, and a conductive layer is buried in the trench to form the source line SL.

Furthermore, the 3D nonvolatile memory device in accordance with an exemplary embodiment of the present invention includes the plurality of drain selection lines DSL_0 to DSL_N extending in parallel to each other and in the second direction II-IP.

The plurality of drain selection lines DSL_0 to DSL_N are coupled to the plurality of channel layers through the channel contacts. In particular, a plurality of drain selection transistors having a gate all around (GAA) structure are buried in the drain selection lines DSL_0 to DSL_N arranged in the second direction II-II', and coupled to the channel contacts. Where the drain selection transistors having a GAA structure are formed in such a manner, the integration degree of the memory device may be increased in comparison to that of a memory device having the flat drain selection transistors.

FIG. 2C illustrates a case in which the plurality of drain selection lines DSL_0 to DSL_N are formed as a single layer and coupled to the plurality of channel layers, respectively. Without being limited thereto, however, the plurality of drain selection lines DSL_0 to DSL_N may be formed as a plurality of layers, or one drain selection line DSL may be coupled to a plurality of channel layers.

Figure 2D:
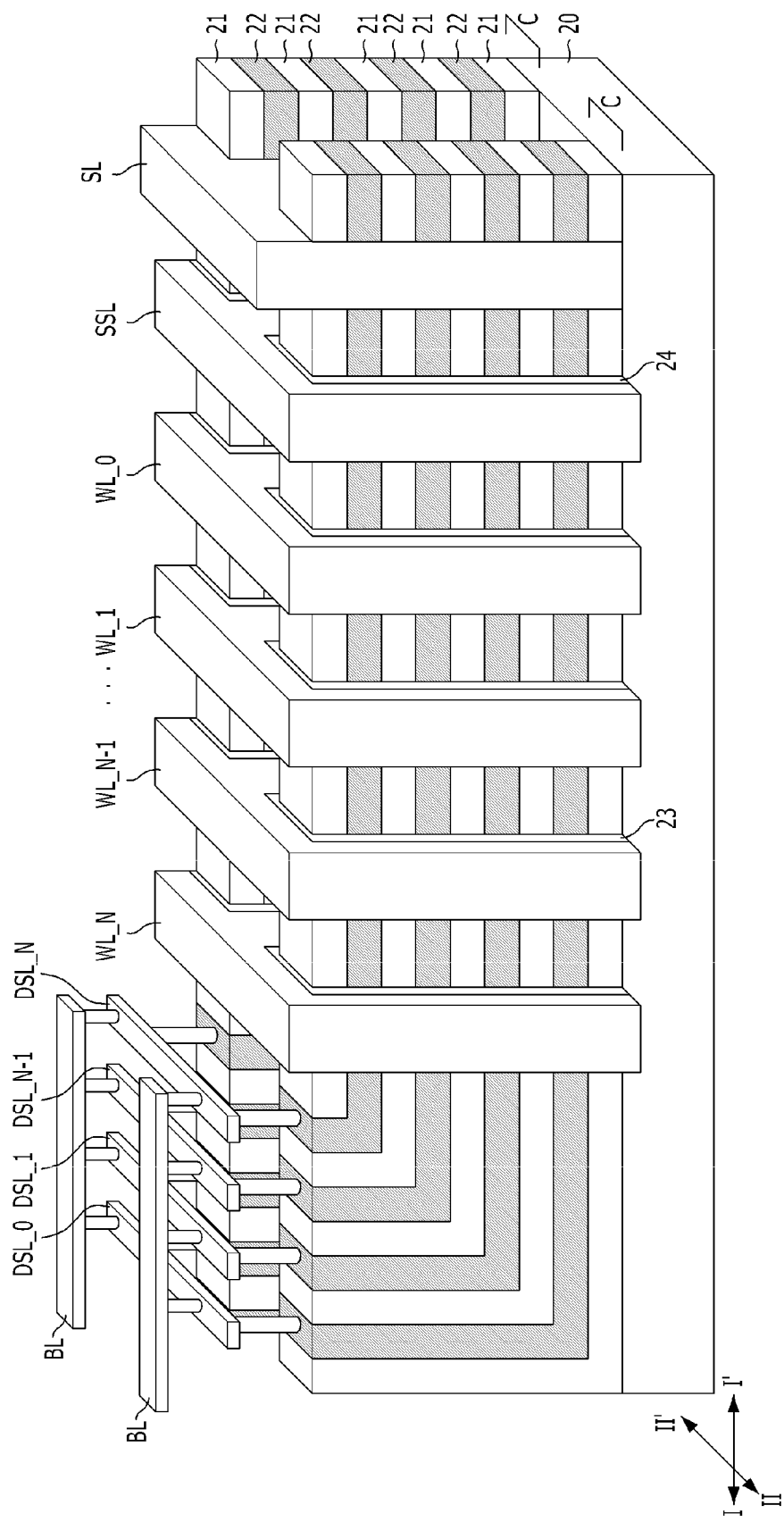
FIG. 2D is a perspective view of a 3D nonvolatile memory device in accordance with another exemplary embodiment of the present invention.

FIG. 2D is a perspective view of a 3D nonvolatile memory device in accordance with another exemplary embodiment of the present invention. FIG. 2D focuses on a channel structure C, and thus, the descriptions of the same components as that described with reference to FIG. 2C will be omitted.

Referring to FIG. 2D, the channel structure C includes a plurality of channel layers 22 and interlayer dielectric layers 21 which are alternatively stacked on a substrate 20, and the plurality of channel layers 22 may be formed to be exposed at one side of the upper surface of the structure C.

FIG. 2D illustrates an example of the channel structure C in which the plurality of channel layers and the interlayer dielectric layers are alternately stacked along an etched surface of a trench and the channel layers 22 are exposed through one side portion of the upper surface of the structure C. The trench may be formed by etching the substrate 20, or by forming a memory block isolation insulation layer on the substrate 20 and then etching the memory block isolation insulation layer.

FIGS. 3A to 3D are cross-sectional views illustrating a method for forming drain selection lines in accordance with a first exemplary embodiment of the present invention, taken along the first direction of FIG. 2C. FIGS. 3A to 3D focus on a region in which the drain selection lines are to be formed, and thus, elements such as the memory cells are omitted.

Figure 3A:
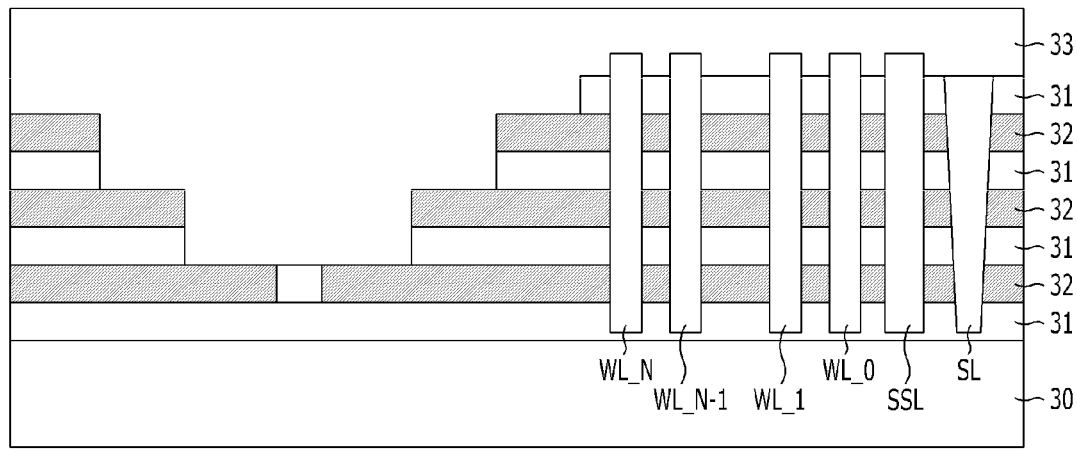
FIGS. 3A to 3D are cross-sectional views illustrating a method for forming drain selection lines in accordance with a first exemplary embodiment of the present invention.

Referring to FIG. 3A, a plurality of interlayer dielectric layers 31 and channel layers 32 are alternately stacked on a substrate 30.

The plurality of interlayer dielectric layers 31 and channel layers 32 are patterned to form a plurality of channel structures C, and the adjacent channel structures C include the isolated channel layers 32, respectively. In particular, the channel layers 32 formed at the lowermost layer are isolated by an insulation layer, and respectively coupled to channel contacts by a subsequent process.

The plurality of interlayer dielectric layers 31 and channel layers 32 are patterned in a stepped shape to expose the plurality of channel layers 32. A first interlayer dielectric layer 33 is formed on the entire surface of the resultant structure.

In FIG. 3A, WL_0 to WL_N represent word lines, SSL represents a source selection line, and SL represents a source line.

Figure 3B:
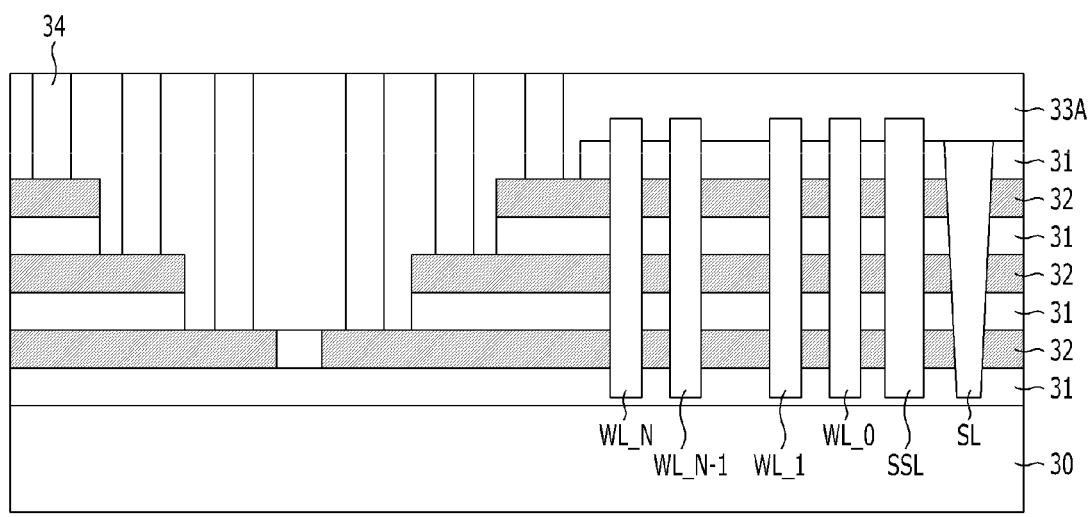

Referring to FIG. 3B, the first interlayer dielectric layer 33 is etched to form a plurality of contact holes which expose the plurality of channel layers 32, respectively.

A conductive layer is buried in the plurality of contact holes to form a plurality of channel contacts 34 coupled to the plurality of channel layers 32, respectively. Here, the channel contacts 34 may be formed so as to be coupled to the respective channel layers 32 at both sides of the channel structure C.

In FIG. 3B, the first interlayer dielectric layer etched during the contact hole formation process is represented by reference numeral 33A.

Figure 3C:
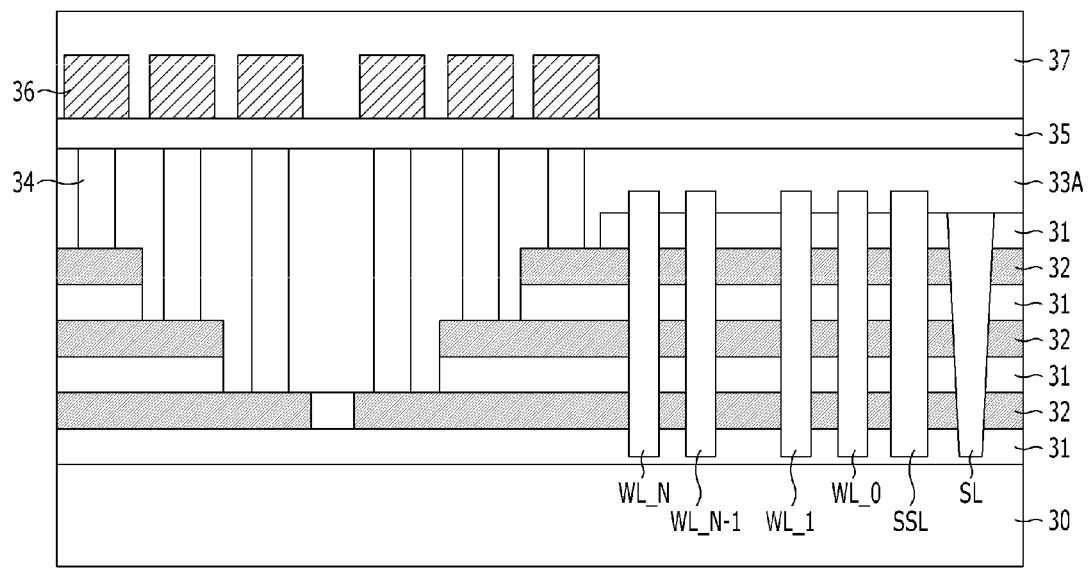

Referring to FIG. 3C, a second interlayer dielectric layer 35 is formed on the resultant structure having the plurality of channel contacts 34 formed therein.

A conductive layer 36 for a drain selection line is formed on the second interlayer dielectric layer 35. The conductive layer 36 includes a plurality of line patterns extending in parallel to each other and in the second direction, and the plurality of line patterns are formed to cover the plurality of channel contacts 34, respectively.

A third interlayer dielectric layer 37 is formed on the entire surface of the resultant structure having the conductive layer 36 formed thereon.

Figure 3D:
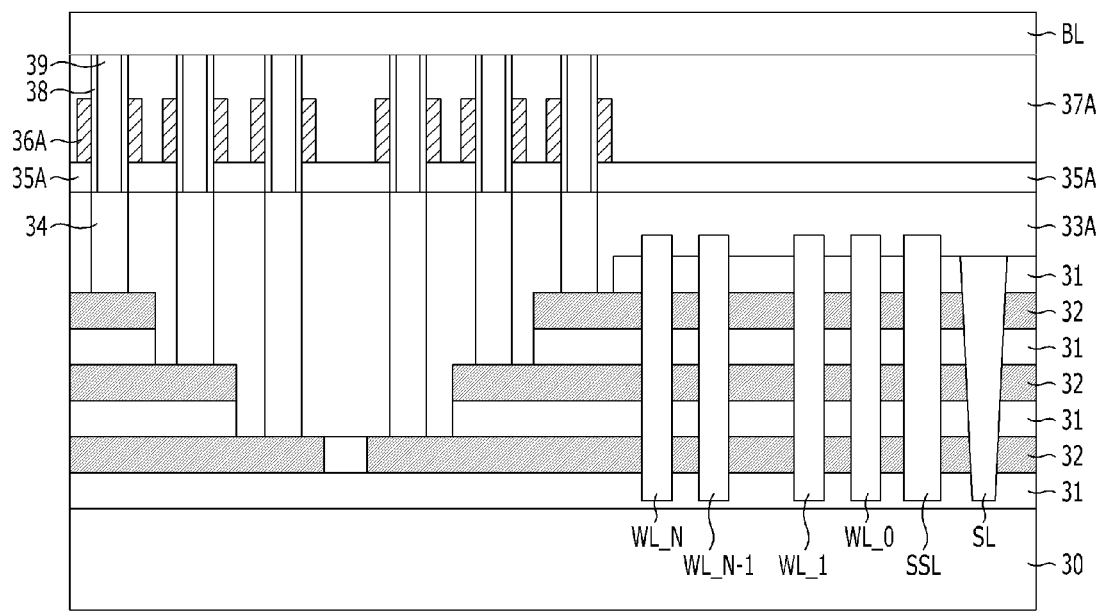

Referring to FIG. 3D, the third interlayer dielectric layer 37, the conductive layers 36, and the second interlayer dielectric layer 35 are etched to form a plurality of trenches which expose the plurality of channel contacts 34, respectively.

In FIG. 3D, the second interlayer dielectric layer etched during the trench formation process is represented by reference numeral 35A, the etched conductive layer is represented by reference numeral 36A, and the etched third interlayer dielectric layer is represented by reference numeral 37A.

A gate dielectric layer 38 is formed on the inner walls of the trenches, and a channel layer is buried in the trenches having the gate dielectric layer 38 formed therein. As such, a plurality of drain selection lines are formed as a single layer. The plurality of drain selection lines extend in a direction crossing the channel structure C, and are vertically coupled to the channel contacts 34 so as to be coupled to the plurality of channel layers 32, respectively.

In particular, a plurality of drain selection transistors having a GAA structure, which are buried in the drain selection lines, are formed. By forming the drain selection transistors having a GAA structure, which includes a pillar-type channel 39, the gate dielectric layer 38 surrounding the outer circumferential surface of the channel 39, and a gate electrode surrounding the outer circumferential surface of the channel 39 having the gate dielectric layer 38 formed thereon, the occurrence of leakage current may be reduced in comparison to that of a flat drain selection transistor. Furthermore, an off characteristic of the drain selection line may be improved. Furthermore, since the plurality of drain selection lines are formed at the same layer, the level of difficulty in the drain selection line formation process decreases.

Subsequently, a plurality of bit lines BL are formed on the third interlayer dielectric layers 37A having the plurality of drain selection lines formed therein. The plurality of bit lines BL are formed over the drain selection lines so as to be coupled to the drain selection transistors, and extend in parallel to each other and in the same direction as the channel structure C, that is, the first direction.

In accordance with the first exemplary embodiment of the present invention, since the channel contacts 34 are coupled to the channel layers 32 and the drain selection lines, respectively, the area of the drain selection line may be reduced. Therefore, the integration degree of the memory device may be increased. Furthermore, since the drain selection transistor is formed with a GAA structure in which the entire surface of the pillar-type channel is covered with the gate electrode, the on/off characteristic of the drain selection transistor may be improved.

Figure 4A:
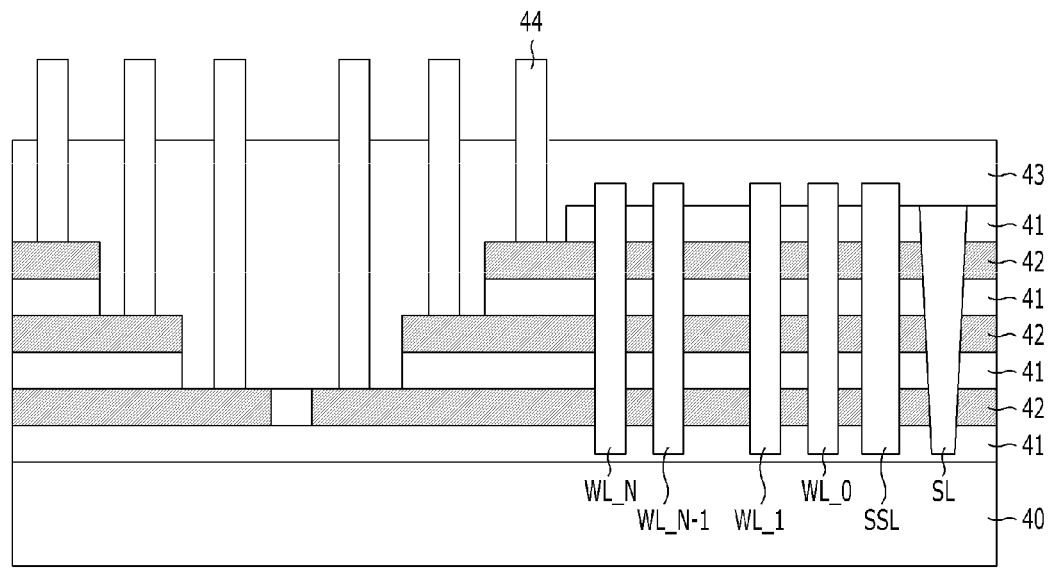
FIGS. 4A to 4C are cross-sectional views illustrating a method for forming drain selection lines in accordance with a second exemplary embodiment of the present invention.
Figure 4B:
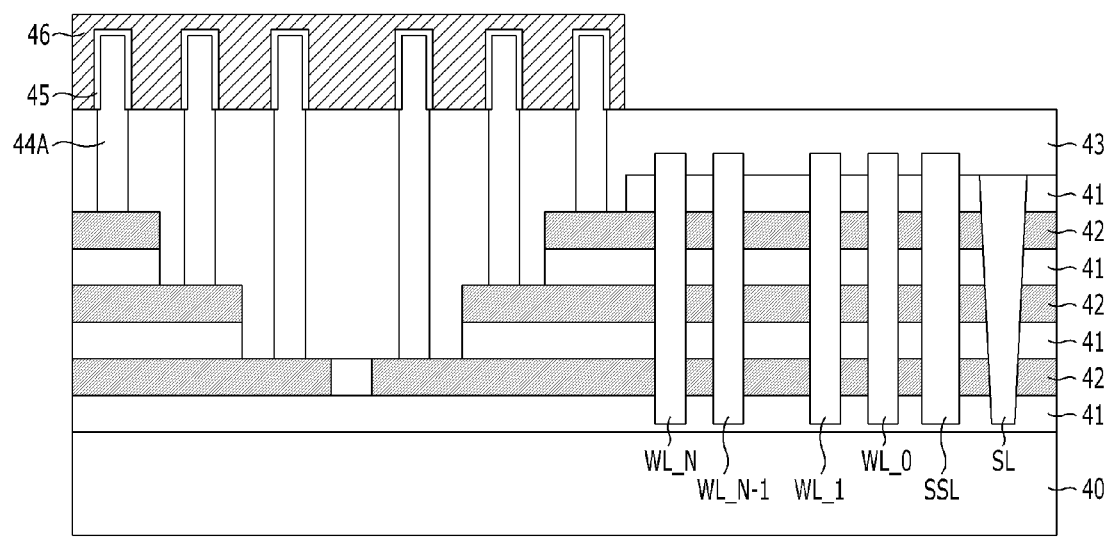
Figure 4C:
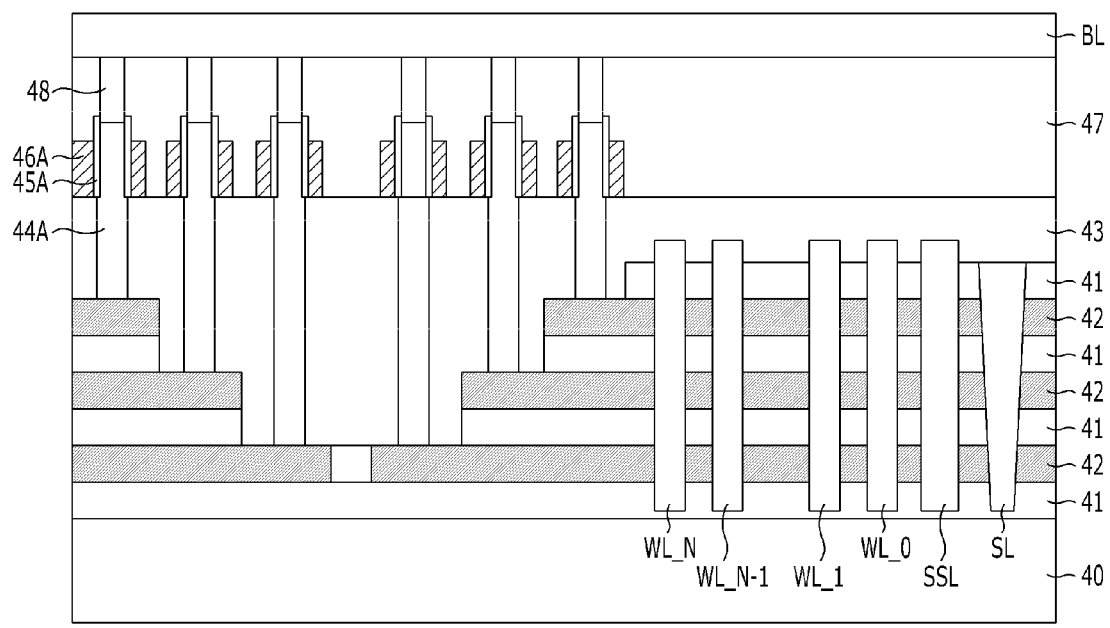

FIGS. 4A to 4C are cross-sectional views illustrating a method for forming drain selection lines in accordance with a second exemplary embodiment of the present invention, taken along the first direction of FIG. 2C. FIGS. 4A to 4C focus on a region in which the drain selection lines are to be formed, and thus, elements such as memory cells are omitted.

Referring to FIG. 4A, a plurality of interlayer dielectric layers 41 and channel layers 42 are alternately formed on a substrate 40, and then patterned in a stepped shape to expose the plurality of channel layers 42.

A first interlayer dielectric layer 43 is formed on the entire surface of the resultant structure, and then etched to form a plurality of contact holes which expose the plurality of channel layers 42, respectively. A conductive layer is buried in the contact holes to form a plurality of channel contacts 44 coupled to the plurality of channel layers 42, respectively.

The first interlayer dielectric layer 43 is recessed to a predetermined depth to expose upper portions of the channel contacts 44.

Referring to FIG. 4B, a gate dielectric layer 45 is formed to surround the exposed upper portions of the channel contacts 44. For example, the gate dielectric layer 45 may be formed on the exposed channel contacts 44 and the upper surface of the first interlayer dielectric layer 43. Furthermore, the gate dielectric layer 45 may include an oxide layer formed by an oxidation process or deposition process. FIG. 4B illustrates a case in which the gate dielectric layer 45 is formed by an oxidation process, and the channel contact of which the upper portion is oxidized by the oxidation process is represented by reference numeral 44A.

When the gate dielectric layer 45 is formed to surround the upper portions of the channel contacts 44A, the upper portions of the channel contacts 44A surrounded by the gate dielectric layer 45 serve as channels of drain selection transistors which are to be formed by a subsequent process.

A conductive layer 46 for a drain selection line is formed on the gate dielectric layer 45. The conductive layer 46 may be formed to cover a drain selection line formation region.

Referring to FIG. 4C, the conductive layer 46 is patterned to form a plurality of drain selection lines extending in parallel to each other and in the second direction. At this time, the etching condition may be adjusted to etch the conductive layer 46 such that the height of the drain selection lines is lower than that of the gate dielectric layer 45.

A second interlayer dielectric layer 47 is formed on the entire surface of the resultant structure having the drain selection lines formed thereon. The second interlayer dielectric layer 47 and the gate dielectric layer 45 are etched to form a plurality of contact holes which expose the channel surfaces of the drain selection transistors.

A conductive layer is buried in the plurality of contact holes to form a plurality of contacts 48 coupled to the respective channels of the drain selection transistors.

A plurality of bit lines BL are formed on the second interlayer dielectric layer 47 so as to extend in the same direction as the channel structure C, that is, the first direction, while being coupled to the drain selection transistors through the contacts 48.

Figure 5:
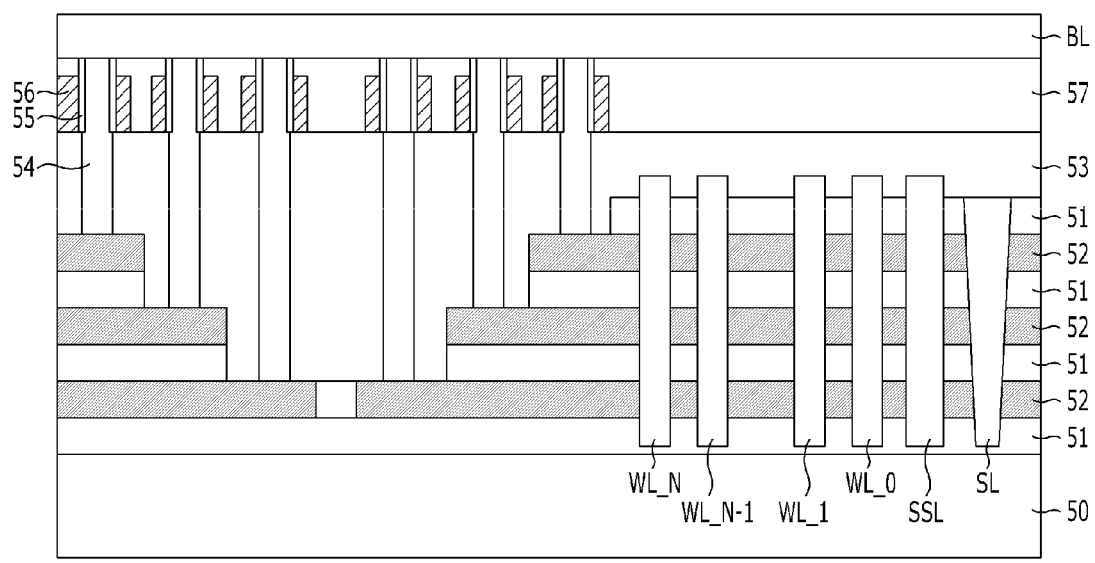
FIG. 5 is a cross-sectional view illustrating a method for forming drain selection lines in accordance with a third exemplary embodiment of the present invention.

FIG. 5 is a cross-sectional view illustrating a method for forming drain selection lines in accordance with a third exemplary embodiment of the present invention, taken along the first direction of FIG. 2C. FIG. 5 focuses on a region in which the drain selection lines are to be formed, and thus, elements such as memory cells are omitted.

Referring to FIG. 5, a plurality of interlayer dielectric layers 51 and channel layers 52 are alternately formed on a substrate 50, and then patterned in a stepped shape to expose the plurality of channel layers 52.

A first interlayer dielectric layer 53 is formed on the resultant structure, and then etched to form a plurality of contact holes which expose the plurality of channel layers 52, respectively. A conductive layer is buried in the contact holes to form a plurality of channel contacts 54 coupled to the plurality of channel layers 52, respectively.

The first interlayer dielectric layer 53 is recessed to a predetermined depth to expose upper portions of the channel contacts 54, and a gate dielectric layer 55 is formed to surround the exposed upper portions of the channel contacts 54.

A conductive layer for a drain selection line is formed on the gate dielectric layer 55, and then patterned to form a plurality of drain selection lines which cover the plurality of channel contacts 54, respectively, while extending in parallel to each other and in the second direction.

A second interlayer dielectric layer 57 is formed on the resultant structure having the plurality of drain selection lines formed thereon, and a planarization process is performed on the resultant structure until the channels of the drain selection transistors are exposed.

A plurality of bit lines BL are formed to extend in the same direction as the channel structure C, that is, the first direction, while being coupled to the channels of the drain selection transistors arranged in the first direction.

Figure 6:
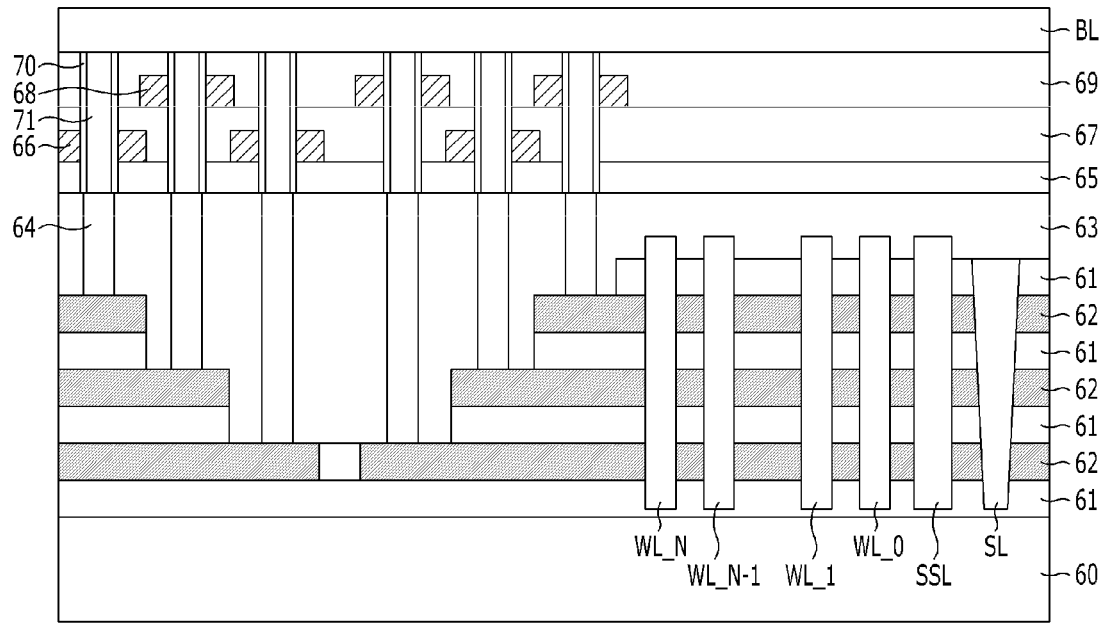
FIG. 6 is a cross-sectional view illustrating a method for forming drain selection lines in accordance with a fourth exemplary embodiment of the present invention.

FIG. 6 is a cross-sectional view illustrating a method for forming drain selection lines in accordance with a fourth exemplary embodiment of the present invention, taken along the first direction of FIG. 2C. FIG. 6 focuses on a region in which the drain selection fines are to be formed, and thus, elements such as memory cells are omitted.

Referring to FIG. 6, a plurality of interlayer dielectric layers 61 and channel layers 62 are alternately formed on a substrate 60, and then patterned in a stepped shape to expose the plurality of channel layers 62.

A first interlayer dielectric layer 63 is formed on the resultant structure, and then etched to form a plurality of contact holes which expose the plurality of channel layers 62, respectively. A conductive layer is buried in the plurality of contact holes to form a plurality of channel contacts 64 coupled to the plurality of channel layers 62, respectively.

A second interlayer dielectric layer 65 is formed on the resultant structure having the channel contacts 64 formed therein, and a first conductive layer 66 for a primary drain selection line is formed on the second interlayer dielectric layer 65. The first conductive layer 66 is formed in a plurality of line patterns extending in parallel to each other and in the second direction, and covering some channel contacts 64 among the plurality of channel contacts 64. For example, the plurality of line patterns are formed to alternately cover the plurality of channel contacts 64.

A third interlayer dielectric layer 67 is formed on the resultant structure having the first conductive layer 66 formed thereon, and a second conductive layer 68 for a secondary drain selection line is formed on the third interlayer dielectric layer 67. The second conductive layer 68 includes a plurality of line patterns extending in parallel to each other and in the second direction, and covering the other channel contacts 64 among the plurality of channel contacts 64. For example, the second conductive layer 68 may be arranged so as not to overlap the first conductive layer 66.

A fourth interlayer dielectric layer 69 is formed on the entire surface of the resultant structure having the second conductive layer 68 formed thereon.

The fourth interlayer dielectric layer 69, the second conductive layer 68, the third interlayer dielectric layer 67, and the second interlayer dielectric layer 65 are etched, or the fourth interlayer dielectric layer 69, the third interlayer dielectric layer 67, the first conductive layer 66, and the second interlayer dielectric layer 65 are etched to form a plurality of trenches which expose the surfaces of the channel contacts 64, respectively.

The plurality of trenches are formed to pass through the first conductive layer 66 or the second conductive layer 68.

A gate dielectric layer 70 is formed on the inner walls of the trenches, and a channel layer is buried in the trenches having the gate dielectric layer 70 formed therein. As such, a plurality of drain selection lines are formed. That is, primary drain selection lines, primary drain selection transistors buried in the primary drain selection lines, secondary drain selection lines, and secondary drain selection transistors buried in the secondary drain selection lines are formed.

In accordance with the third exemplary embodiment of the present invention, the plural layers of drain selection lines are formed. FIG. 6 illustrates an exemplary case in which the drain selection lines are formed at two layers. The layer number of the drain selection lines may be decided by considering the area of the drain selection lines and the integration degree of the memory device. Because of the arrangement of the plural layers of drain selection lines, the area of the drain selection line may be further reduced.

A plurality of bit lines BL are formed on the fourth interlayer dielectric layer 69 so as to extend in parallel to each other and in the same direction as the channel structure C, that is, the first direction, while being coupled to the drain selection transistors.

Figure 7:
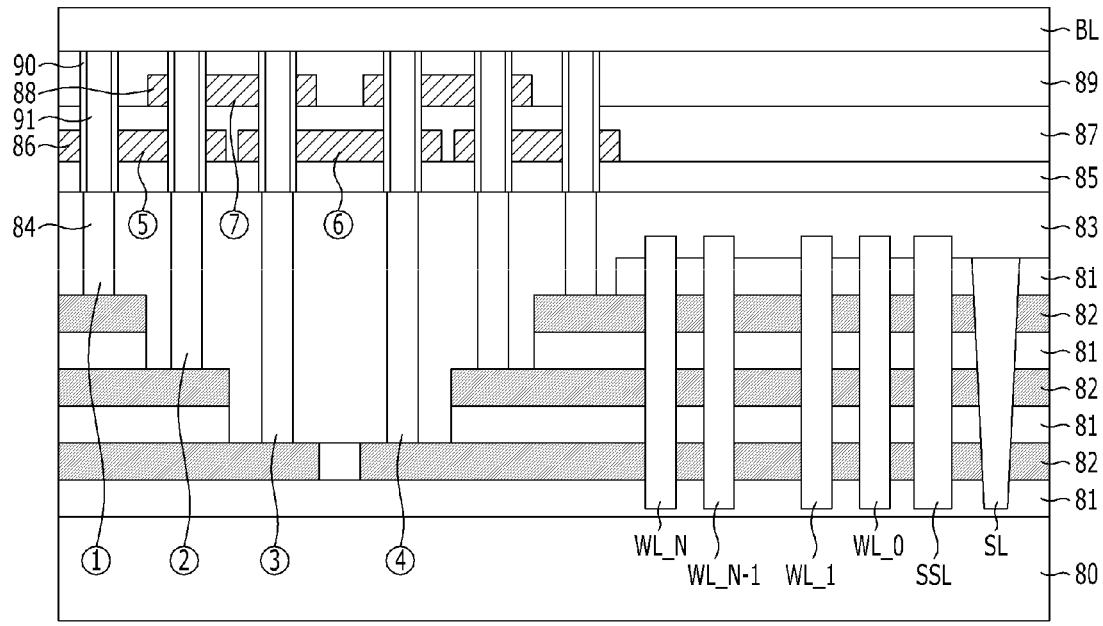
FIG. 7 is a cross-sectional view illustrating a method for forming drain selection lines in accordance with a fifth exemplary embodiment of the present invention.

FIG. 7 is a cross-sectional view illustrating a method for forming drain selection lines in accordance with a fifth exemplary embodiment of the present invention, taken along the first direction of FIG. 2C. FIG. 7 focuses on a region in which the drain selection lines are to be formed, and thus, elements such as memory cells are omitted.

Referring to FIG. 7, a plurality of interlayer dielectric layer 81 and channel layers 82 are alternately formed on a substrate 80, and then patterned in a stepped shape to expose the plurality of channel layers 82.

A first interlayer dielectric layer 83 is formed on the entire surface of the resultant structure, and then etched to form a plurality of contact holes which expose a plurality of channel layers 82, respectively. A conductive layer is buried in the contact holes to form a plurality of channel contacts 84 coupled to the plurality of channel layers 82, respectively.

A second interlayer dielectric layer 85 is formed on the resultant structure having the channel contacts 84 formed therein, and a first conductive layer 86 for a primary drain selection line is formed on the second interlayer dielectric layer 85. The first conductive layer 86 has a plurality of line patterns extending in parallel to each other and in the second direction, and each of the line patterns is formed to cover at least two adjacent channel contacts 84.

A third interlayer dielectric layer 87 is formed on the entire surface of the resultant structure having the first conductive layer 86 formed therein.

A second conductive layer 88 for a secondary drain selection line is formed on the third interlayer dielectric layer 87. The second conductive layer 88 has a plurality of line patterns extending in parallel to each other and in the second direction, and each of the line patterns is formed to cover at least two adjacent channel contacts 84. In particular, the second conductive layer 88 may be formed to share some channel contacts with the first conductive layer 86, while overlapping the adjacent first conductive layer 86.

A fourth interlayer dielectric layer 89 is formed on the resultant structure having the second conductive layer 88 formed thereon.

The fourth interlayer dielectric layer 89, the second conductive layer 88, the third interlayer dielectric layer 87, the first conductive layer 86, and the second interlayer dielectric layer 85 are etched to form a plurality of trenches which expose the surfaces of the plurality of channel contacts 84, respectively.

The plurality of trenches are formed to pass through the second conductive layer 88 and the first conductive layer 86.

A gate dielectric layer 90 is formed on the inner walls of the trenches, and a channel layer is buried in the trenches having the gate dielectric layer 90 formed therein. As such, a plurality of drain selection lines are formed.

FIG. 7 shows a case in which one drain selection line is coupled to two channel layers 82. That is, a primary drain selection line and a secondary drain selection line are respectively coupled to two channel contacts 84, and arranged to overlap each other. For example, when a primary drain selection line ⑤ is coupled to first and second channel contacts ① and ② and a primary drain selection line ⑥ is coupled to third and fourth channel contacts ③ and ④, a secondary drain selection line ⑦ is formed to be coupled to the second and third channel contacts ② and ③. Therefore, a desired channel layer 82 may be selected by a combination of the primary drain selection lines ⑤ and ⑥ and the secondary drain selection line ⑦.

That is, the primary drain selection lines and the secondary drain selection lines are respectively coupled to at least two channel contacts 84, and overlap each other to share some channel contacts 84.

A plurality of bit lines BL are formed on the fourth interlayer dielectric layer 89 so as to extend in parallel to each other and in the same direction as the channel structure C, that is, the first direction, while being coupled to the drain selection transistors.

Figure 8:
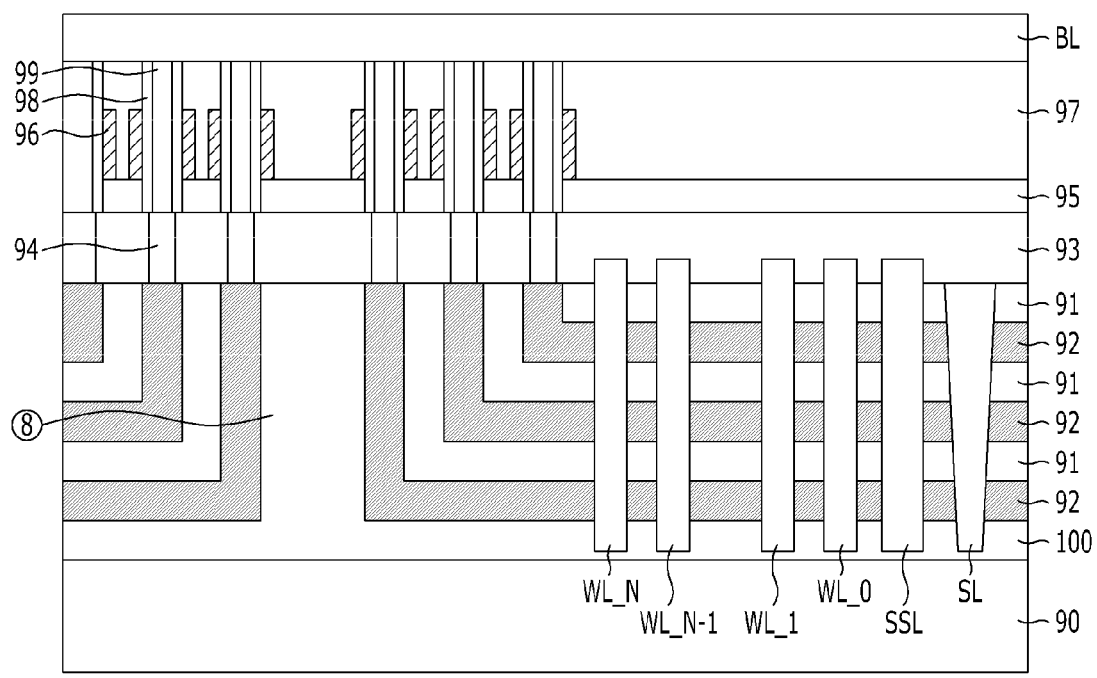
FIG. 8 is a cross-sectional view illustrating a method for forming drain selection lines in accordance with a sixth exemplary embodiment of the present invention.

FIG. 8 is a cross-sectional view illustrating a method for forming drain selection lines in accordance with a sixth exemplary embodiment of the present invention, taken along the first direction of FIG. 2D. FIG. 8 focuses on a region in which the drain selection lines are to be formed, and thus, elements such as memory cells are omitted.

Referring to FIG. 8, a block isolation insulation layer 100 is formed on a substrate 90. A string formation region of the block isolation insulation layer 100 is etched to form a plurality of trenches spaced apart by a predetermined interval.

A plurality of interlayer dielectric layers 91 and channel layers 92 are alternately formed along the etched surfaces of the trenches. At this time, the plurality of interlayer dielectric layers 91 and channel layers 92 are formed along the inner walls of the trenches.

A planarization process is performed until the surface of the block isolation insulation layer 100 is exposed. Then, the plurality of channel layers 92 which are sequentially stacked along the inner walls of the trenches are exposed. Furthermore, the plurality of interlayer dielectric layers 91 and channel layers 92 buried in the adjacent trenches are isolated from each other by a block isolation wall ⑧. In accordance with the sixth exemplary embodiment of the present invention, the plurality of channel layers 92 may be exposed without a separate patterning process.

In this exemplary embodiment, it is described that the trenches are formed after the block isolation insulation layer 100 is formed on the substrate 90. However, the present invention is not limited thereto. Furthermore, after the trenches are formed by etching the substrate 90, the plurality of interlayer dielectric layers 91 and channel layers 92 may be alternately stacked. In this case, the channel layers 92 may be formed after the interlayer dielectric layers 91 are formed.

A first interlayer dielectric layer 93 is formed on the entire surface of the resultant structure, and then etched to form a plurality of contact holes which expose the plurality of channel layers 92, respectively. A conductive layer is buried in the contact holes to form a plurality of channel contacts 94 which are coupled to the plurality of channel layers 92, respectively.

A second interlayer dielectric layer 95 is formed on the resultant structure having the channel contacts 94 formed therein, and a conductive layer 96 for a drain selection line is formed on the second interlayer dielectric layer 95. The conductive layer 96 includes a plurality of line patterns extending in parallel to each other and in the second direction, and covering the plurality of channel contacts 94, respectively.

A third interlayer dielectric layer 97 is formed on the entire surface of the resultant structure having the conductive layer 96 formed thereon.

The third interlayer dielectric layer 97, the conductive layer 96, and the second interlayer dielectric layer 95 are etched to form a plurality of trenches, and a gate dielectric layer 98 is formed on the inner walls of the trenches. A channel layer is buried in the trenches having the gate dielectric layer 98 formed therein. As such, a plurality of drain selection lines are formed to be coupled to the plurality of channel layers 92 through the plurality of channel contacts 94, respectively.

A plurality of bit lines BL are formed to extend in parallel to each other and in the first direction.

In accordance with an exemplary embodiment of the present invention, drain selection transistors, including the pillar-type channel, the gate dielectric layer surrounding the outer circumferential surface of the channel, and the gate electrode surrounding the outer circumferential surface of the channel having the gate dielectric layer formed thereon, are formed so that the drain selection transistors have a GAA structure. Therefore, the occurrence of leakage current may be reduced in comparison to that of a flat drain selection transistor. Furthermore, the off characteristic of the drain selection transistor may be improved. Furthermore, since the plurality of drain selection lines are formed at the same layer, the level of difficulty in the drain selection line formation process decreases.

Furthermore, as the plurality of channel layers are coupled to the drain selection lines through the channel contacts, respectively, the area of the drain selection line may be reduced. Therefore, the integration degree of the memory device may be increased. Furthermore, since the drain selection transistors are formed with a GAA structure in which the gate electrode surrounds the entire surface of the pillar-type channel, the on/off characteristics of the drain selection transistors may be improved.

Hereafter, referring to FIGS. 9A to 9C, the drain selection lines and the drain selection transistors in accordance with the exemplary embodiments of the present invention will be described in detail on the basis of the descriptions with reference to FIGS. 5 to 7, i.e. third to fifth exemplary embodiments. For convenience of explanation, FIGS. 9A and 9C focus on the drain selection lines and the drain selection transistors, and thus, elements such as the memory cells are not shown in detail.

In accordance with exemplary embodiments of the present invention which are described below, a selection line may be formed of a low-resistance metallic layer in order to reduce its resistance. Furthermore, a gate electrode formed of a silicon layer may be inserted between the selection line and a gate dielectric layer of a selection transistor to substantially prevent a direct contact between the selection line and the gate dielectric layer, thereby substantially preventing a malfunction of the drain selection transistor which may occur when the selection line is formed of a low-resistance metallic layer.

Figure 9A:
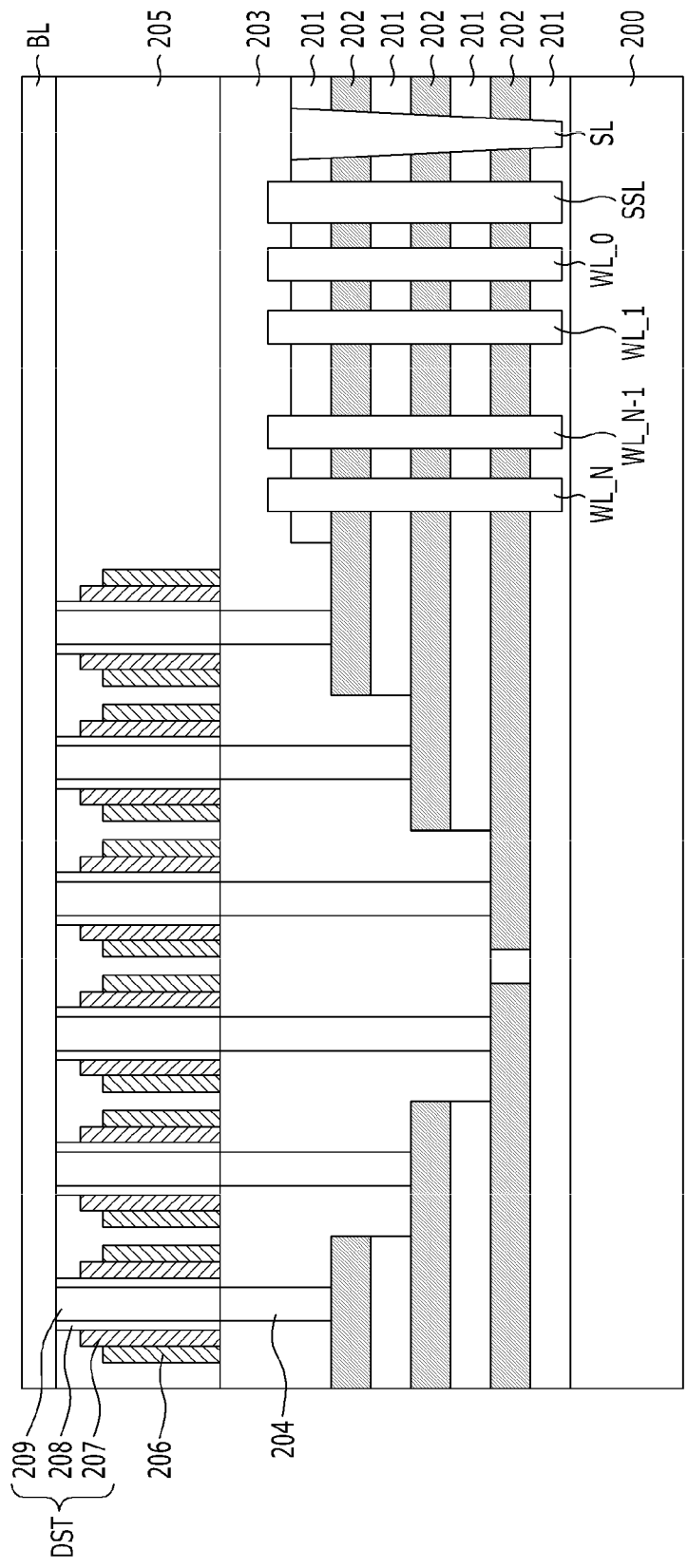
FIG. 9A is a cross-sectional view of a 3D nonvolatile memory device having drain selection lines and drain selection transistors in accordance with another exemplary embodiment of the present invention.

FIG. 9A is a cross-sectional view of a 3D nonvolatile memory device having drain selection lines and drain selection transistors in accordance with an exemplary embodiment of the present invention, which can be described with reference to FIG. 5.

Referring to FIG. 9A, the 3D nonvolatile memory device in accordance with an exemplary embodiment of the present invention includes a plurality of channel structures C, a first interlayer dielectric layer 203, a plurality of channel contacts 204, a plurality of drain selection lines 206, and a plurality of drain selection transistors DST. Each of the channel structures C includes a plurality of channel layers 202 and interlayer dielectric layers 201 which are alternately stacked on a substrate 200. The first interlayer dielectric layer 203 is formed on the substrate 200 so as to cover the plurality of channel structures C. The plurality of channel contacts 204 are formed by passing through the first interlayer dielectric layer 203 and coupled to the plurality of channel layers 202, respectively, at both sides of the channel structures C. The drain selection lines 206 are formed to cross over the channel structures C and include a low-resistance material, for example, a metallic layer. The plurality of drain selection transistors DST having a GAA structure are formed to pass through the drain selection lines 206 and to be coupled to the channel contacts 204. Here, the low-resistance material, for example, the metallic layer includes any one selected from the group consisting of a metal layer, a metal oxide layer, a metal nitride layer, and a metal silicide layer, or a multilayer thereof.

Furthermore, the 3D nonvolatile memory device in accordance with an exemplary embodiment of the present invention further includes a second interlayer dielectric layer 205 and a bit line BL. The second interlayer dielectric layer 205 is formed on the first interlayer dielectric layer 203 so as to cover the plurality of drain selection lines 206 and drain selection transistors DST, and the bit line BL is formed over the drain selection lines 206, that is, on the second interlayer dielectric layer 205 so as to cross over the drain selection lines 206, and to be coupled to the drain selection transistors DST.

Each of the drain selection transistors DST having a GAA structure includes a pillar-type channel 209 vertically-coupled to the channel contact 204, a gate dielectric layer 208 surrounding the pillar-type channel 209, and a gate electrode 207 surrounding the gate dielectric layer 208. The gate electrode 207 may be formed of a silicon layer, in order to substantially prevent the drain selection line 206 formed of a metallic layer from coming into contact with the gate dielectric layer 208 and improve a contact property therebetween. For example, the silicon layer may include a polysilicon layer.

In an exemplary embodiment of the present invention, the drain selection line 206 is formed to surround the gate electrode 207. Here, the drain selection line 206 including a metallic layer not only serves as an interconnection, but also serves as another gate electrode of the drain selection transistor DST in a contact region with the gate electrode 207. At this time, since the metallic layer has lower resistance than the silicon layer, the resistance property of the gate electrode 207 of the drain selection transistor DST may be improved by the drain selection line 206. As a result, the operation characteristic of the drain selection transistor DST may be improved.

The drain selection line 206 has a structure that surrounds the gate electrode 207 of the drain selection transistor DST and couples the gate electrodes 207 arranged in the second direction. Furthermore, the drain selection line 206 has a structure that extends in a direction crossing over the channel structure C.

In the 3D nonvolatile memory device having the above-described structure, since the drain selection transistor DST has a GAA structure, the occurrence of leakage current may be reduced in comparison to that of a flat drain selection transistor. Furthermore, the off characteristic of the drain selection transistor DST may be improved. Furthermore, an area occupied by the drain selection transistor DST may be reduced, thereby increasing the integration degree of the memory device. Furthermore, since the plurality of drain selection lines 206 and drain selection transistors DST are arranged in the same layer, the level of difficulty in the process for forming the drain selection lines 206 and the drain selection transistors DST may be reduced. Furthermore, since the drain selection line 206 is formed of a low-resistance metallic layer, a signal transmission property of the drain selection line 206 may be improved. Furthermore, since the gate dielectric layer 208 surrounding the pillar-type channel 209 is surrounded by the gate electrode 207 formed of a silicon layer and the drain selection line 206 formed of a metallic layer has a structure that surrounds the gate electrode 207, a malfunction of the drain selection transistor caused by a direct contact of the gate dielectric layer 208 with the drain selection line 206 may be substantially prevented.

FIG. 9B is a cross-sectional view of a 3D nonvolatile memory device having drain selection lines and drain selection transistors in accordance with another exemplary embodiment of the present invention, which can be described with reference to FIG. 6. Hereafter, for convenience of explanation, like reference numerals are given to the same components as those of FIG. 9A.

Referring to FIG. 9B, the 3D nonvolatile memory device in accordance with an exemplary embodiment of the present invention includes a plurality of channel structures C, a first interlayer dielectric in layer 203, a plurality of channel contacts 204, a plurality of primary and secondary drain selection lines 206 and 211, and a plurality of drain selection transistors DST. Each of the channel structures C includes a plurality of channel layers 202 and interlayer dielectric layer 201 which are alternately stacked on a substrate 200. The first interlayer dielectric layer 203 is formed on the substrate 200 so as to cover the plurality of channel structures C. The plurality of channel contacts 204 are formed through the first interlayer dielectric layer 203 and are coupled to the plurality of channel layers 202, respectively, at both sides of the channel structures C. The primary and secondary drain selection lines 206 and 211 cross over the channel structures C and are formed of a metallic layer. The drain selection transistor DST is coupled to the channel contact 204 by passing through the primary or secondary drain selection line 206 or 211 and has a GAA structure. The 3D nonvolatile memory device in accordance with an exemplary embodiment of the present invention further includes a bit line BL which is formed over the primary and secondary drain selection lines 206 and 211, crosses over the primary and second drain selection lines 206 and 211, and is coupled to the drain selection transistors DST.

The arrangement of the primary and second drain selection lines 206 and 211 is described in detail as follows. The primary drain selection lines 206 are formed on the first interlayer dielectric layer 203 and coupled to some channel contacts 204 among the plurality of channel contacts 204 through the drain selection transistors DST. The secondary drain selection lines 211 are formed on a second interlayer dielectric layer 205, coupled to the other channel contacts 204 through the drain selection transistors DST, and arranged so as not to overlap the primary drain selection lines 206. The 3D nonvolatile memory device in accordance with an exemplary embodiment of the present invention further includes a third interlayer dielectric layer 210 covering the secondary drain selection lines 211.

The drain selection transistor DST having a GAA structure includes a pillar-type channel 209 vertically-coupled to the channel contact 204, a gate dielectric layer 208 surrounding the pillar-type channel 209, and a gate electrode 207 surrounding the gate dielectric layer 208. The gate electrode 207 may be formed of a silicon layer, in order to substantially prevent the primary and secondary drain selection lines 206 and 211, formed of a metallic layer, from coming into contact with the gate dielectric layer 208 thereby improving a contact property therebetween. For example, the silicon layer may include a polysilicon layer.

In an exemplary embodiment of the present invention, the primary and secondary drain selection lines 206 and 211 are formed to surround the gate electrode 207. The primary and secondary drain selection lines 206 and 211 including a metallic layer not only serve as interconnections, but also serve as another gate electrode of the drain selection transistor DST in a contact region with the gate electrode 207. At this time, since the metallic layer has a lower resistance than the silicon layer, the resistance property of the gate electrode 207 of the drain selection transistor DST may be improved by the primary and second drain selection lines 206 and 211. As a result, the operation characteristic of the drain selection transistor DST may be improved.

The primary and secondary drain selection lines 206 and 211 have a structure that surrounds the gate electrodes 207 of the drain selection transistor DST and couples the gate electrodes 207 arranged in the second direction. Furthermore, the primary and secondary drain selection lines 206 and 211 have a structure that extends in a direction crossing over the channel structure C.

The 3D nonvolatile memory device having the above-described structure in FIG. 9B may exhibit the effect implemented by the 3D nonvolatile memory device illustrated in FIG. 9A. Furthermore, since the primary and secondary drain selection lines 206 and 211 are arranged so as not to overlap each other and positioned in different layers, the distance between the drain selection lines formed in each layer may be more easily secured, thereby reducing the level of difficulty in the formation process. Furthermore, the 3D nonvolatile memory device illustrated in FIG. 9B has an advantage in that the area occupied by the drain selection lines may be reduced in comparison to that of the 3D nonvolatile memory device illustrated in FIG. 9A.

For reference, FIG. 9B illustrates an exemplary case in which the drain selection lines are formed at two layers. However, this is an example for convenience of explanation, and the layer number of the drain selection lines may be decided by considering the region in which the drain selection lines are to be formed and the integration degree of the memory device.

Figure 9C:
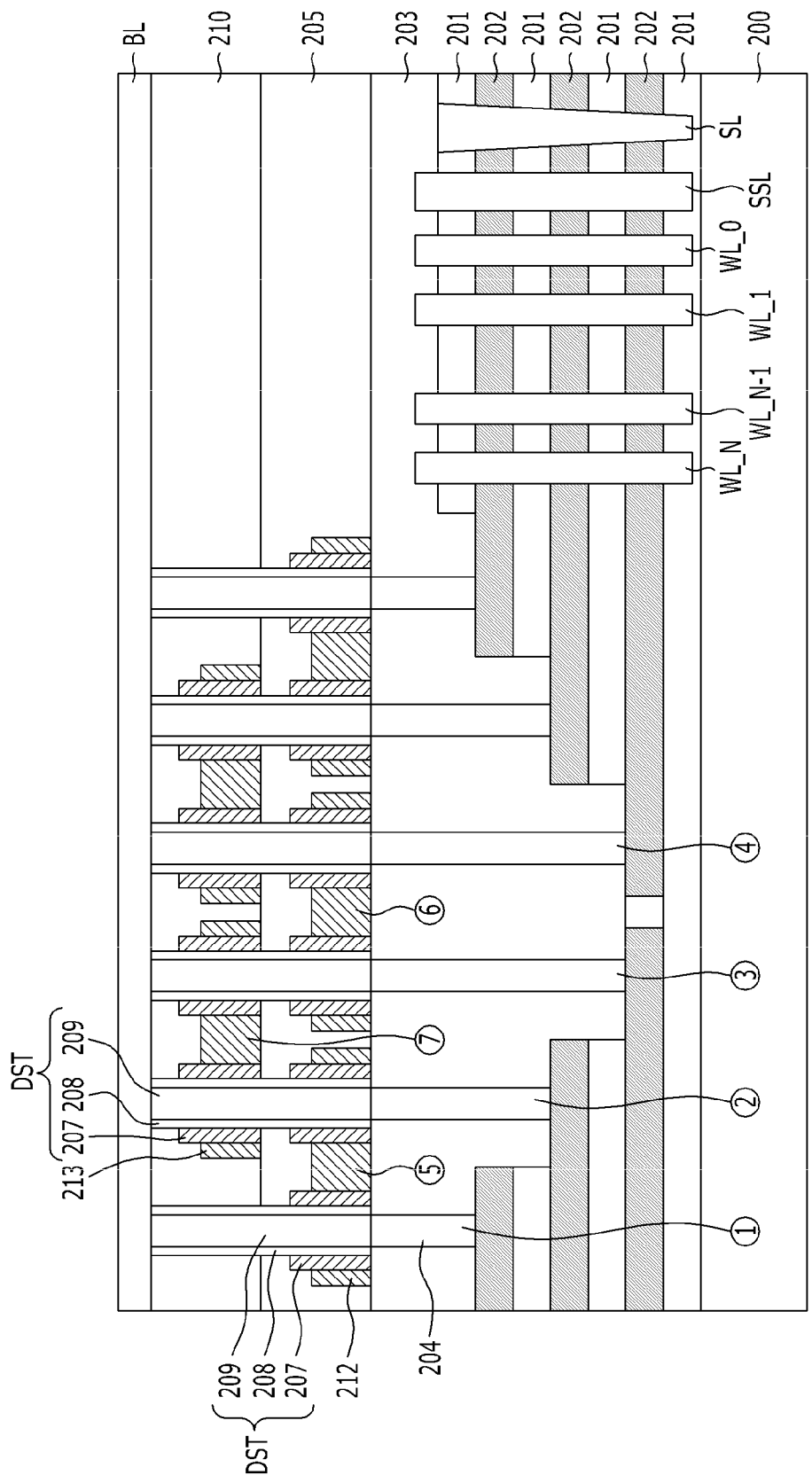
FIG. 9C is a cross-sectional view of a 3D nonvolatile memory device having drain selection lines and drain selection transistors in accordance with another exemplary embodiment of the present invention.

FIG. 9C is a cross-sectional view of a 3D nonvolatile memory device having drain selection lines and drain selection transistors in accordance with another exemplary embodiment of the present invention, which can be described with reference to FIG. 7. Hereafter, for convenience of explanation, like reference numerals are given to the same components as those of FIGS. 9A and 9B.

Referring to FIG. 9C, the 3D nonvolatile memory device in accordance with an exemplary embodiment of the present invention includes a plurality of channel structures C, a first interlayer dielectric layer 203, a plurality of channel contacts 204, a plurality of primary and secondary drain selection lines 212 and 213, and a plurality of drain selection transistors DST. Each of the channel structures C includes a plurality of channel layers 202 and interlayer dielectric layer 201 which are alternately stacked on a substrate 200. The first interlayer dielectric layer 203 is formed on the substrate 200 so as to cover the plurality of channel structures C. The plurality of channel contacts 204 are formed through the first interlayer dielectric layer 203 and are coupled to the plurality of channel layers 202, respectively, at both sides of the channel structures C. The primary and secondary drain selection lines 212 and 213 cross over the channel structures C and are formed of a metallic layer. The drain selection transistors DST are coupled to the channel contacts 204 through the primary drain selection lines 212 or the secondary drain selection lines 213 and have a GAA structure. The 3D nonvolatile memory device in accordance with an exemplary embodiment of the present invention further includes a bit line BL which is formed over the primary and secondary drain selection lines 212 and 213 so as to cross over the primary and secondary drain selection lines 212 and 213, and which is coupled to the drain selection transistors DST.

The arrangement of the primary and secondary drain selection lines 212 and 213 is described in detail as follows. Each of the primary drain selection lines 212 is formed on the first interlayer dielectric layer 203 and coupled to at least two adjacent channel contacts 204 among the plurality of channel contacts 204 through the drain selection transistor DST. Each of the secondary drain selection lines 213 is formed on a second interlayer dielectric layer 205 and coupled to at least two adjacent channel contacts 204 among the plurality of channel contacts 204 through the drain selection transistors DST. The 3D nonvolatile memory device in accordance with an exemplary embodiment of the present invention further includes a third interlayer dielectric layer 210 which covers the secondary drain selection lines 213. That is, the primary and secondary drain selection lines 212 and 213 are respectively coupled to at least two channel contacts 204, and have a structure in which they overlap each other to share some channel contacts 204.

More specifically, the primary and secondary drain selection lines 212 and 213 are respectively coupled to at least two channel contacts 204, and arranged to overlap each other. For example, when a primary drain selection line ⑤ is coupled to first and second channel contacts ① and ② and a primary drain selection line is coupled to third and fourth channel contacts ③ and ④, a secondary drain selection line ⑦ may be coupled to the second and third channel contacts ② and ③. Therefore, a desired channel layer 202 may be selected by a combination of the primary drain selection lines ⑤ and ⑥ and the secondary drain selection line ⑦.

The drain selection transistor DST, having a GAA structure, includes a pillar-type channel 209 vertically-coupled to the channel contact 204, a gate dielectric layer 208 surrounding the pillar-type channel 209, and a gate electrode 207 surrounding the gate dielectric layer 208. The gate electrode 207 may be formed of a silicon layer, in order to substantially prevent the primary and secondary drain selection lines 212 and 213, which are formed of a metallic layer, from coming into contact with the gate dielectric layer 208, thereby improving a contact property therebetween. For example, the silicon layer may include a polysilicon layer.

In an exemplary embodiment of the present invention, the primary and secondary drain selection lines 212 and 213 are formed to surround the gate electrode 207. The primary and secondary drain selection lines 212 and 213, including a metallic layer, not only serve as interconnections, but also serve as another gate electrode of the drain selection transistor DST in a contact region with the gate electrode 207. At this time, since the metallic layer has lower resistance than the silicon layer, the resistance property of the gate electrode 207 of the drain selection transistor DST may be improved by the primary and secondary drain selection lines 212 and 213. As a result, the operation characteristic of the drain selection transistor DST may be improved.

The primary and secondary drain selection lines 212 and 213 have a structure that surrounds the gate electrode 207 of the drain selection transistor DST and couples the gate electrodes 207 arranged in the second direction. Furthermore, the primary and secondary drain selection lines 212 and 213 have a structure that extends in a direction crossing over the channel structure C.

The 3D nonvolatile memory device having the above-described structure in FIG. 9C exhibits the effect implemented by the 3D nonvolatile memory device illustrated in FIG. 9A. Furthermore, since the primary and secondary drain selection lines 212 and 213 are arranged in different layers, respectively coupled to at least two or more channel contacts 204, and share some channel contacts 204, the distance between the drain selection lines formed in each layer may be more easily secured, thereby reducing the level of difficulty in the formation process. Furthermore, since the volume of the drain selection lines is increased more than in the 3D nonvolatile memory devices illustrated in FIGS. 9A and 9B, the 3D nonvolatile memory device illustrated in FIG. 9C has an advantage in that the signal transmission property of the drain selection lines may be effectively improved, and the area occupied by forming the drain selection lines may be reduced.

Hereafter, a method for fabricating the drain selection lines and the drain selection transistors of FIGS. 9A to 9C will be described in detail. For convenience of explanation, a method for fabricating the 3D nonvolatile memory device having the structure illustrated in FIG. 9A is taken as an example. Accordingly, methods for fabricating the 3D nonvolatile memory devices having the structures illustrated in FIGS. 9B and 9C will be easily understood by those skilled in the art, based on the method which is described below.

FIGS. 10A to 10F are cross-sectional views illustrating a method for fabricating a 3D nonvolatile memory device in accordance with an exemplary embodiment of the present invention. FIGS. 10A to 10F are taken along the first direction of FIG. 2C and focus on a region in which drain selection lines are to be formed, and thus, elements such as memory cells are omitted.

Figure 10A:
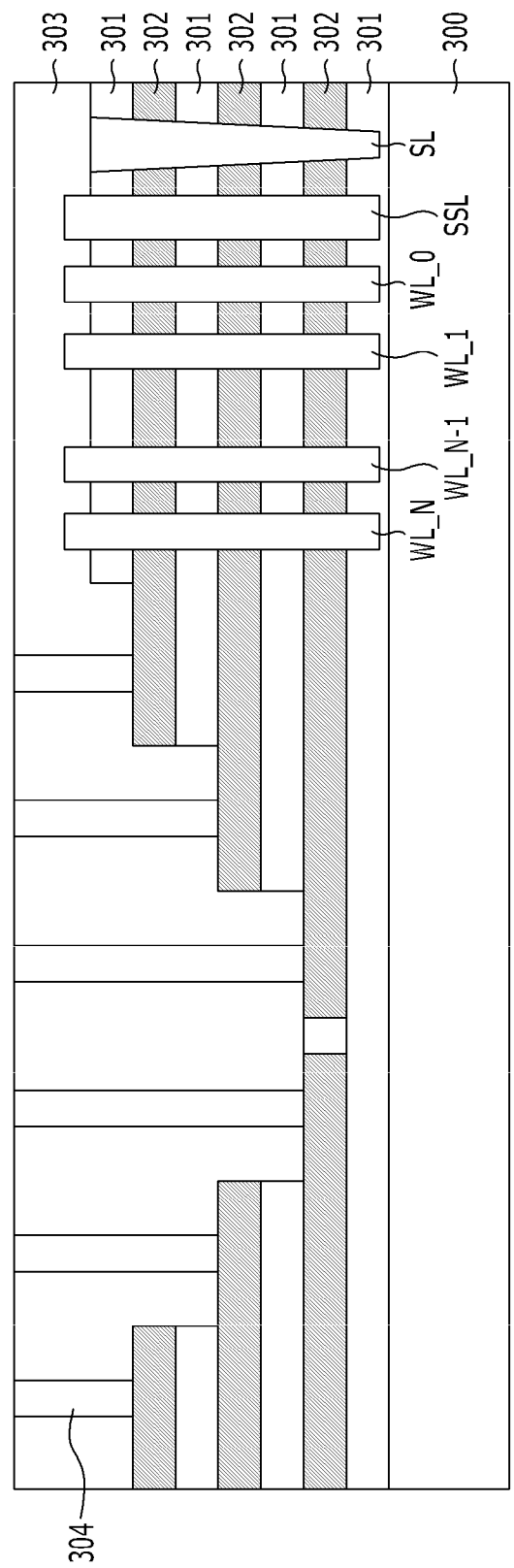

Referring to FIG. 10A, a plurality of interlayer dielectric layers 301 and channel layers 302 are alternately stacked on a substrate 300. The plurality of interlayer dielectric layers 301 and channel layers 302 are patterned to form a plurality of channel structures C, and the adjacent channel structures C respectively include isolated channel layers 302. In particular, the channel layers 302 formed at the lowermost layer are isolated from each other by the interlayer dielectric layer 301, and the respective channel layers 302 are coupled to channel contacts by a subsequent process.

The plurality of interlayer dielectric layers 301 and channel layers 302 are patterned in a stepped shape to expose the plurality of channel layers 302. A first interlayer dielectric layer 303 is formed on the entire surface of the resultant structure. In FIG. 10A, WL_0 to WL_N represent word lines, SSL represents a source selection line, and SL represents a source line.

The first interlayer dielectric layer 303 is etched to form a plurality of contact holes which expose the plurality of channel layers 302, respectively, and a conductive layer is buried in the plurality of contact holes to form a plurality of channel contacts 304 coupled to the plurality of channel layers 302, respectively. The channel contacts 304 may be formed to be coupled to the plurality of channel layers 302, respectively, at both sides of the channel structure C.

Figure 10B:
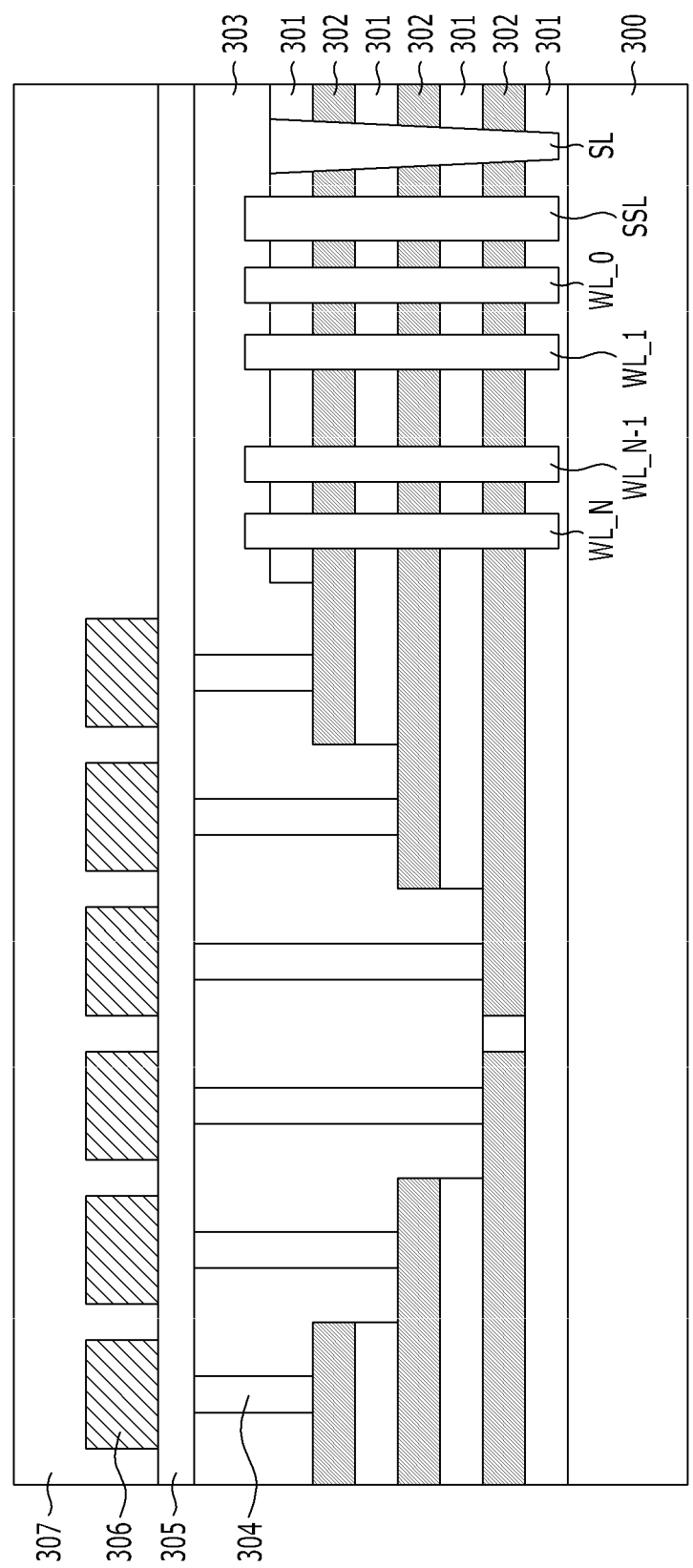

Referring to FIG. 10B, a second interlayer dielectric layer 305 is formed on the resultant structure having the plurality of channel contacts 304 formed therein, and a plurality of drain selection lines 306 are formed on the second interlayer dielectric layer 305. At this time, the drain selection lines 306 may include a plurality of line patterns which are formed by the following process: a conductive layer for a drain selection line is deposited on the entire surface of the second interlayer dielectric layer 305 and then selectively etched to form a plurality of line patterns which extend in parallel to each other and in the second direction. The plurality of drain selection lines 306 are formed to cover the channel contacts 304 arranged in the second direction.

The drain selection line 306 is formed of a low-resistance conductive metallic layer, in order to improve a signal transmission property of the memory device. The conductive metallic layer includes any one selected from the group consisting of a metal layer such as W or Cu, a metal oxide layer such as $IrO_2$, a metal nitride layer such as TiN, and a metal silicide layer such as $WSi_x$ or a multilayer in which two or more these layers are stacked. For reference, where a polysilicon layer is used as the drain selection line 306 in the conventional 3D nonvolatile memory device, the signal transmission property of the memory device is degraded by high resistance of the polysilicon layer.

A third interlayer dielectric layer 307 is formed on the entire surface of the resultant structure having the drain selection lines 306 formed thereon.

Referring to FIG. 10C, the third interlayer dielectric layer 307 and the drain selection lines 306 are selectively etched to form a plurality of holes 308 which expose the second interlayer dielectric layer 305 over the plurality of channel contacts 304. That is, the holes 308 have a structure that passes through the center of the drain selection line 306 and exposes the second interlayer dielectric layer 305 over the channel contact 304. Hereafter, the etched third interlayer dielectric layer 307 and the etched drain selection line 306 are represented by reference numerals 307A and 306A, respectively.

The holes 308 provide a space in which a gate electrode, a gate dielectric layer, and a pillar-type channel for a drain selection transistor are to be formed, and are formed to have a larger width than the channel contact 304 and a smaller width than the drain selection line 306.

Figure 10D:
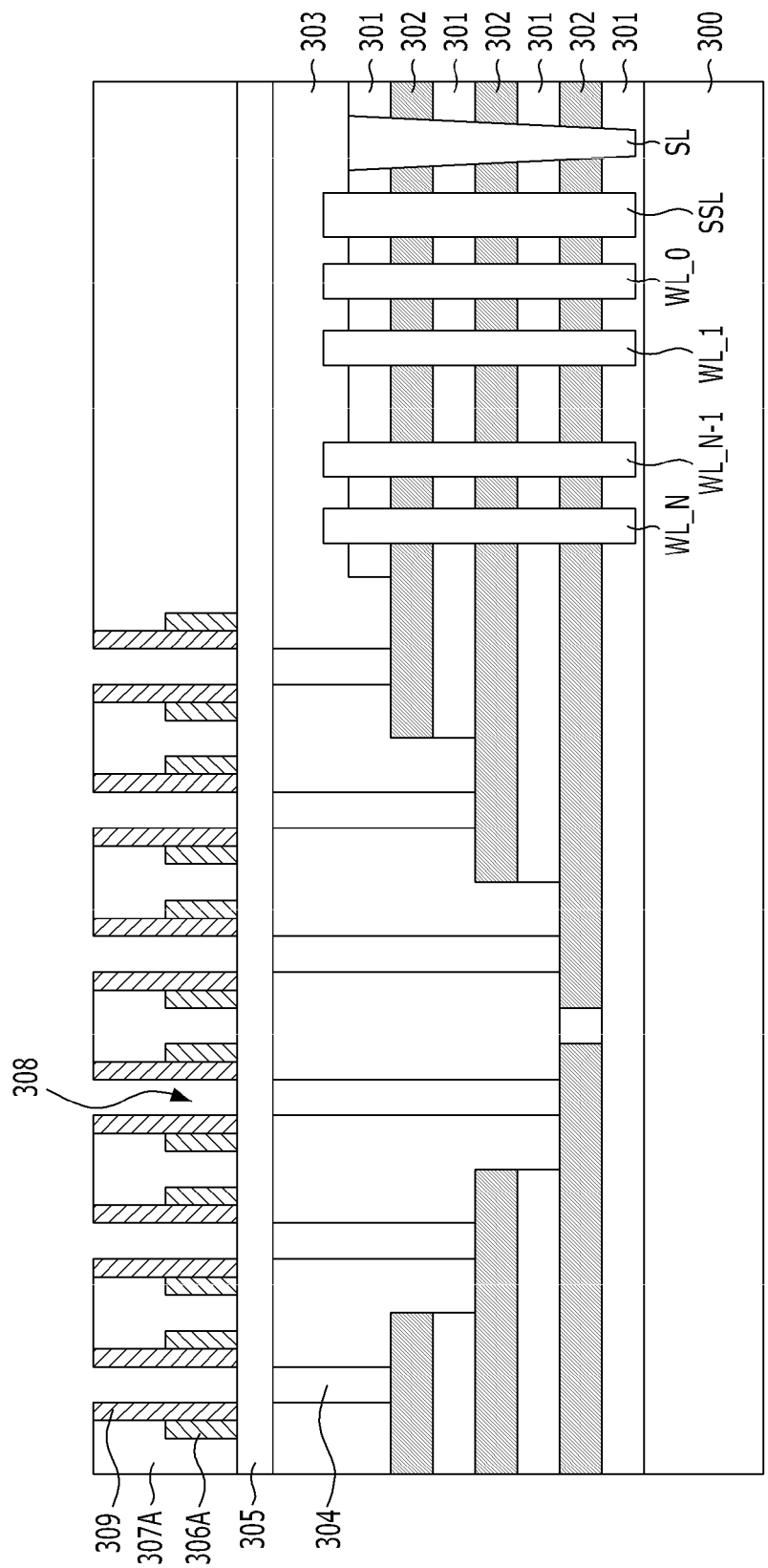

Referring to FIG. 10D, a gate conductive layer, for example, a silicon layer, is formed along the surface of the resultant structure having the holes 308 formed therein. A slimming process, for example, an etch back process, is performed in such a manner that the gate conductive layer remains on the sidewalls of the holes 308, thereby forming a gate electrode 309 of the drain selection transistor which is formed of a silicon layer. At this time, the silicon layer may include a polysilicon layer.

Referring to FIG. 10E, the gate electrode 309 is overetched in such a manner that the upper surface of the gate electrode 309 is set to a lower level than the upper surface the third interlayer dielectric layer 307A. This process is performed to prevent a short circuit between the gate electrode 309 and a bit line which is to be formed by a subsequent process. Here, the upper surface of the gate electrode 309 is set to a higher level than the upper surface of the drain selection line 306A, thereby blocking a direct contact of the drain selection line 306A with a gate dielectric layer which is to be formed by a subsequent process. Hereafter, the over-etched gate electrode 309 is represented by reference numeral 309A.

The second interlayer dielectric layer 305, which is exposed through the holes 308 after the gate electrodes 309A are formed, is etched to expose the channel contacts 304. Hereafter, the holes 308 which are extended to expose the channel contacts 304 are represented by reference numeral 308A, and the etched second interlayer dielectric layer 305 is represented by reference numeral 305A.

Meanwhile, the over-etching process of the gate electrodes 309A and the etching process of the second interlayer dielectric layer 305 for exposing the channel contacts 304 may be separately performed as described above, or simultaneously performed.

Referring to FIG. 10F, an insulation layer 310 is formed along the surface of the resultant structure having the gate electrodes 309A formed therein, and a slimming process, for example, an etch back process, is performed to form a gate dielectric layer 310 on the sidewalls of the holes 308A. At this time, the drain selection lines 306A formed of a metallic layer are not in contact with the gate dielectric layer 310 by the gate electrodes 309A formed on the sidewalls of the holes 308A.

The holes 308A, having the gate dielectric layer 310 formed therein, are filled with a channel layer to form a plurality of pillar-type channels 311. Accordingly, the plurality of drain selection lines 306A are arranged in the same layer, and a plurality of drain selection transistors DST having a GAA structure are formed through the drain selection lines 306A so as to be coupled to the channel contacts 304. The plurality of drain selection lines 306A extend in a direction crossing over the channel structure C, that is, the second direction, and are coupled to the channel contacts 304 and the channel layers 302 through the drain selection transistors DST passing through the drain selection lines 306A.

As a result, the drain selection transistors DST have a structure that includes the pillar-type channel 311 coupled to the channel contact 304, the gate dielectric layer 310 surrounding the pillar-type channel 311, the gate electrode 309A surrounding the gate dielectric layer 310 and formed of a silicon layer, and the drain selection line 306A surrounding the gate electrode 309A and formed of a low-resistance metallic layer.

A plurality of bit lines BL are formed on the third interlayer dielectric layer 307A having the plurality of drain selection lines 306A formed therein. The plurality of bit lines BL are formed over the drain selection lines 306A, are coupled to the drain selection transistors DST, and extend in parallel to each other and in the same direction of the channel structure C, that is, the first direction.

FIGS. 11A to 11E are cross-sectional views illustrating a method for fabricating a 3D nonvolatile memory device in accordance with another exemplary embodiment of the present invention. FIGS. 11A to 11E are taken along the first direction of FIG. 2C and focus on an area in which drain selection lines are to be formed, and thus, elements such as memory cells are omitted.

Figure 11A:
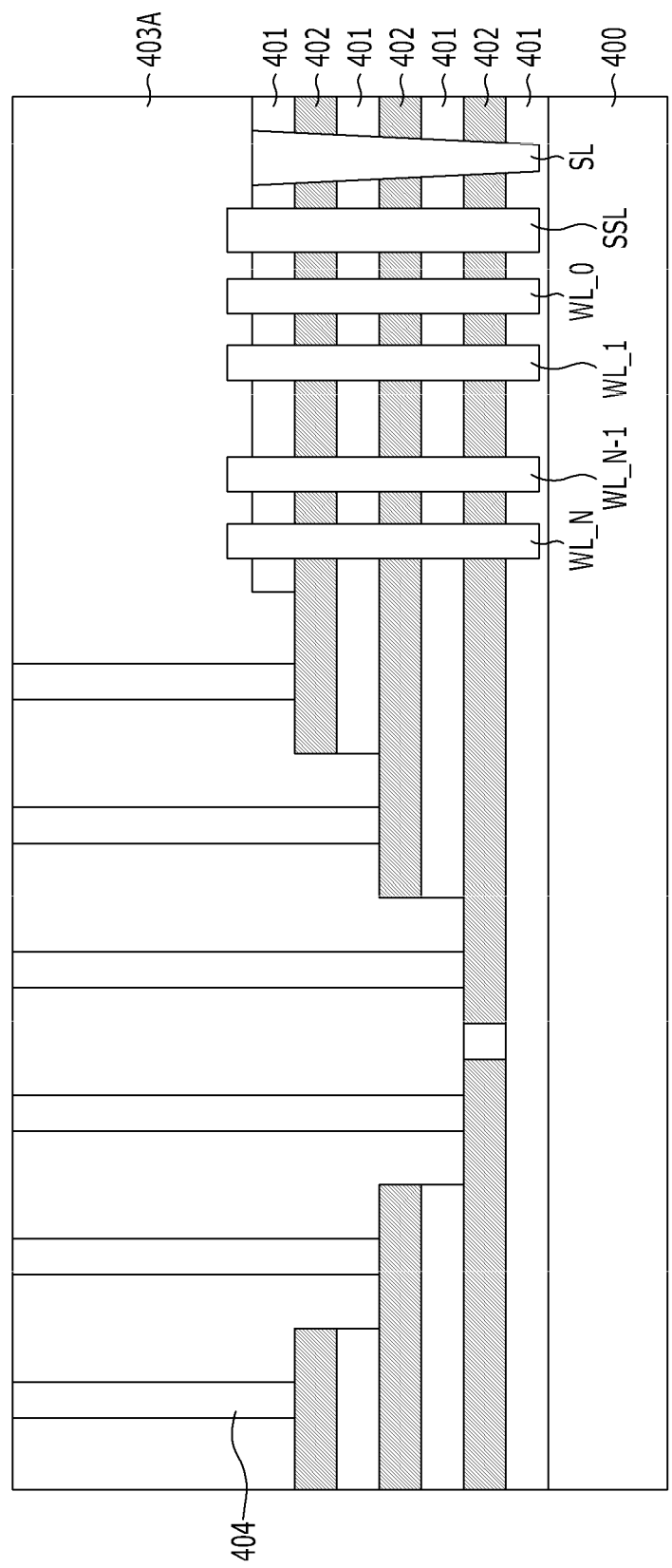

Referring to FIG. 11A, a plurality of interlayer dielectric layers 401 and channel layers 402 are alternately stacked on a substrate 400. The plurality of interlayer dielectric layers 401 and channel layers 402 are patterned to from a plurality of channel structures C, and the adjacent channel structures C respectively include isolated channel layers 402. In particular, the channel layers 402 formed at the lowermost layer is isolated from each other by the interlayer dielectric layers 401, and the respective channel layers 402 are coupled to channel contacts by a subsequent process.

The plurality of interlayer dielectric layers 401 and channel layers 402 are patterned in a stepped shape to expose the channel layers 402. A first interlayer dielectric layer 403 is formed on the entire surface of the resultant structure. In FIG. 10A, WL_0 to WL_N represent word lines, SSL represents a source selection line, and SL represents a source line.

The first interlayer dielectric layer 403 is etched to form a plurality of contact holes which expose the plurality of channel layers 402, respectively. Hereafter, the first interlayer dielectric layer 403, having the contact holes formed therein, is represented by reference numeral 403A.

A conductive layer is buried in the plurality of contact holes to form a plurality of channel contacts 404 coupled to the plurality of channel layers 402, respectively. The channel contacts 404 may be formed to be coupled to the plurality of channel layers 402, respectively, at both sides of the channel structure C.

Figure 11B:
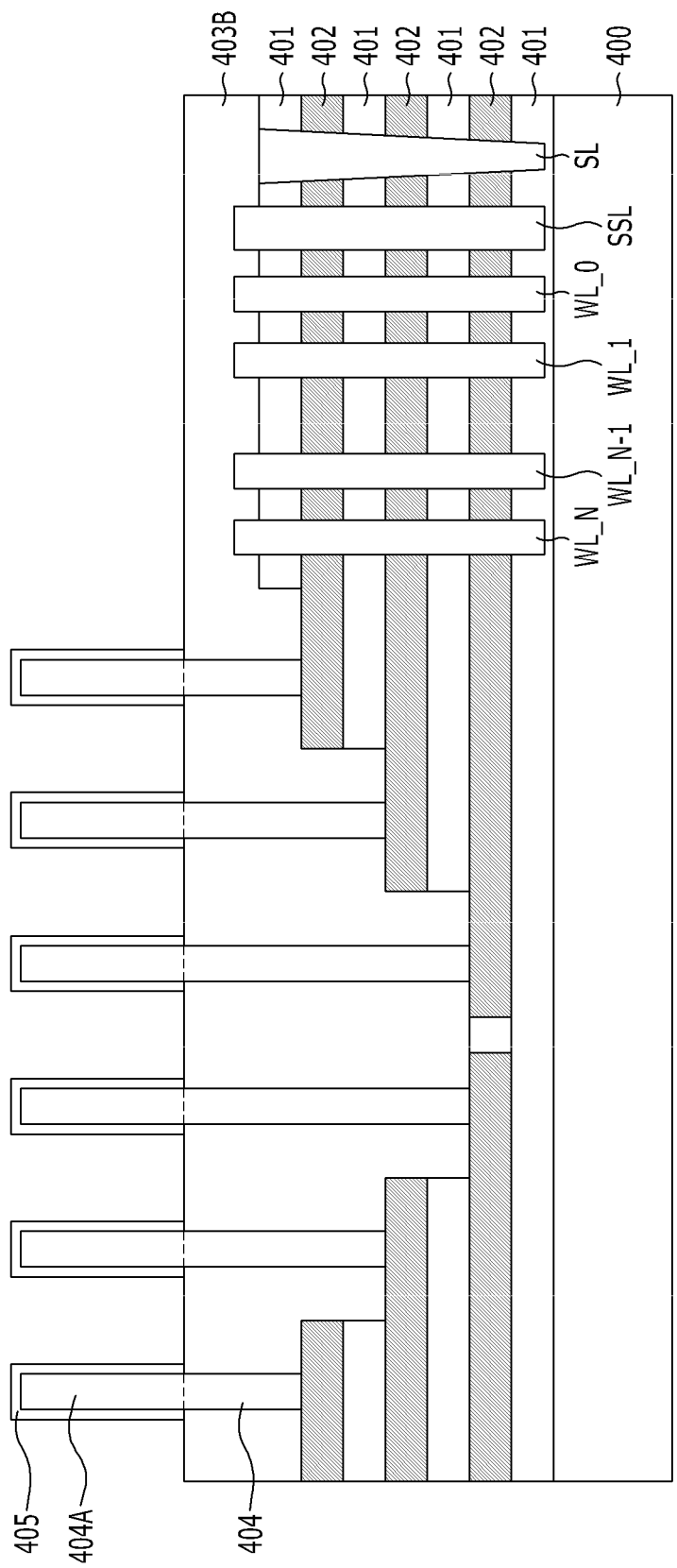

Referring to FIG. 11B, the first interlayer dielectric layer 403A is recessed to a predetermined thickness so that portions of the channel contacts 404 protrude from the first interlayer dielectric layer 403A. At this time, the portions of the channel contacts 404 protruding from the first interlayer dielectric layer 403A serve as pillar-type channels 404A of drain selection transistors. Hereafter, the recessed first interlayer dielectric layer 403A is represented by reference numeral 403B.

The gate dielectric layer 405 is formed on the surfaces of the pillar-type channels 404A. At this time, the gate dielectric layer 405 may be formed of any one single layer selected from the group consisting of an oxide layer, a nitride layer, and an oxy-nitride layer or a multilayer in which two or more these layers are stacked. For example, when the gate dielectric layer 405 is formed of an oxide layer, the gate dielectric layer 405 may be formed by oxidizing the surfaces of the pillar-type channels 404A or by performing an oxide deposition process.

Referring to FIG. 11C, a gate conductive layer is formed along the surface of the resultant structure having the gate dielectric layer 405 formed thereon, and a slimming process, for example, an etch back process is performed to form a gate electrode 406 surrounding the sidewalls of the pillar-type channel 404A with the gate dielectric layer 405 therebetween. At this time, the gate electrode 406 may be formed of a silicon layer, for example, a polysilicon layer. Furthermore, the gate electrode 406 is formed in such a manner that the upper surface of the gate electrode 406 is set to a lower level than the upper surface of the pillar-type channel 404A.

As such, a plurality of drain selection transistors DST having a GAA are formed.

Figure 11D:
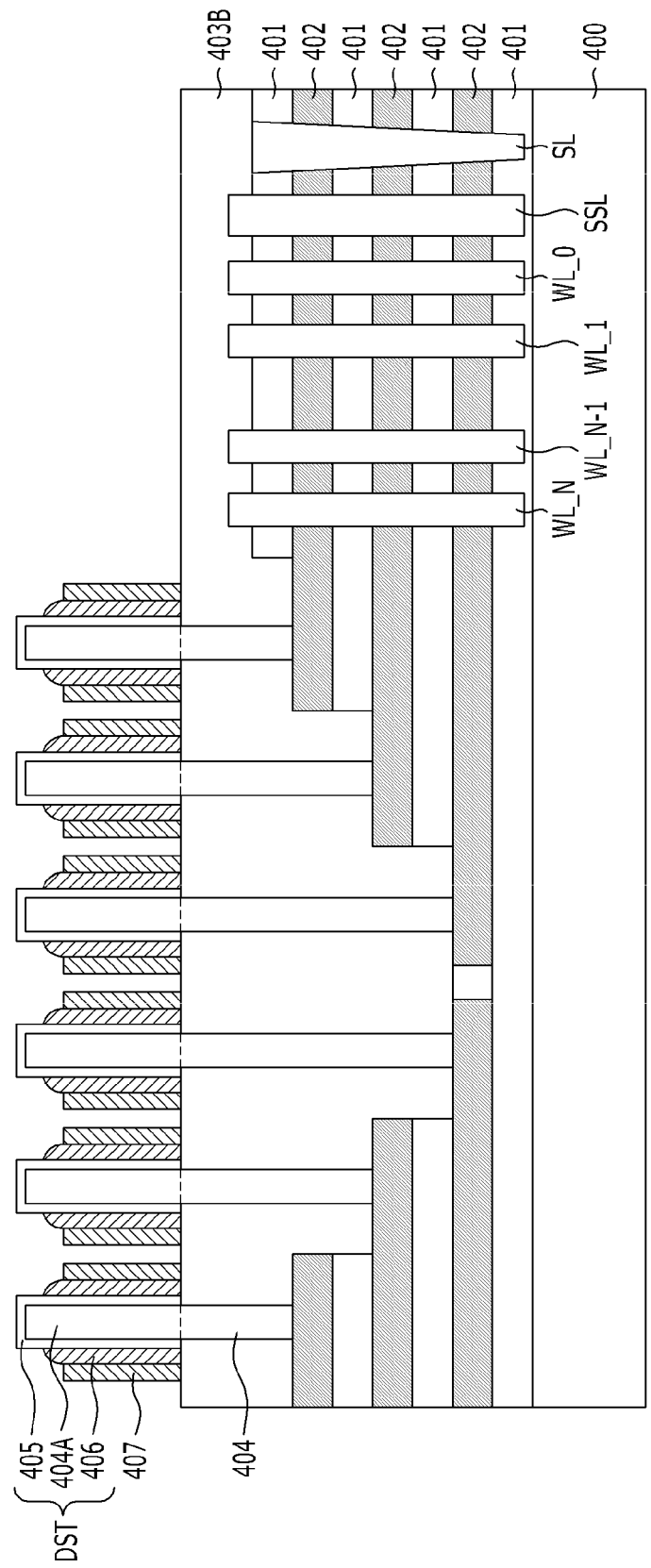

Referring to FIG. 11D, a conductive layer for a drain selection line is formed to partially fill the space between the pillar-type channels 404A. That is, the conductive layer is formed on the first interlayer dielectric layer 403B so as to have a smaller thickness than the gate electrode 406. At this time, the conductive layer for the drain selection line is formed of a low-resistance metallic layer. The conductive layer may be formed by a series of processes in which a conductive layer is deposited on the entire surface of the substrate 400 and a slimming process, for example, an etch back process, is then performed.

The conductive layer for the drain selection line, which partially fills the space between the pillar-type channels 404A, is selectively etched to form a plurality of drain selection lines 407 which surround the respective gate electrodes 406 and couple the plurality of gate electrodes 406 arranged in the second direction. That is, the drain selection lines 407 have a structure that extends in the second direction, and are coupled to the channel contacts 404 through the drain selection transistors DST passing through the drain selection lines 407.

As a result, the drain selection transistor DST has a structure that includes the pillar-type channel 404A coupled to the channel contact 404, the gate dielectric layer 405 surrounding the pillar-type channel 404A, and the gate electrode 406 surrounding the gate dielectric layer 405 and formed of a silicon layer. Furthermore, the drain selection line 407 has a structure that surrounds the gate electrode 406, and is formed of a low-resistance metallic layer.

Figure 11E:
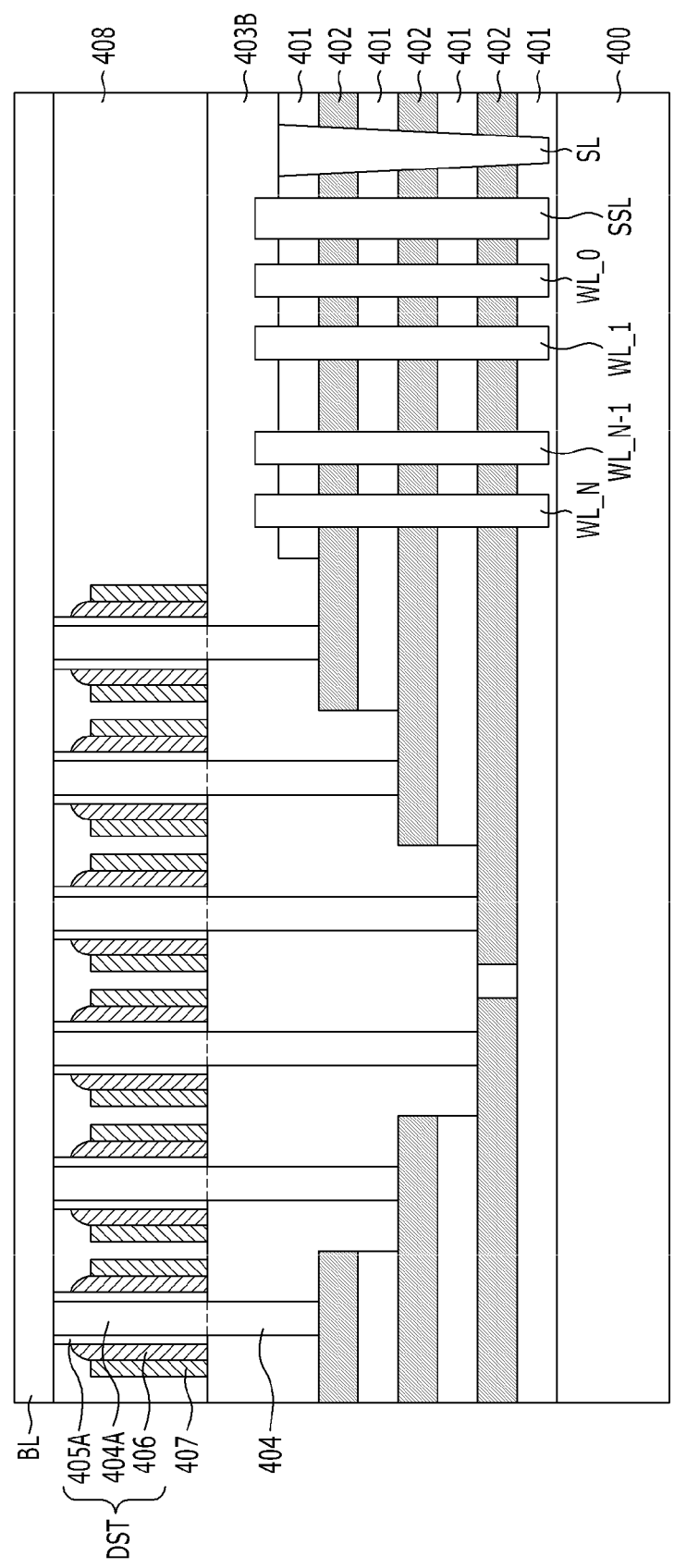

Referring to FIG. 11E, a second interlayer dielectric layer 408 is formed on the first interlayer dielectric layer 403B, and a planarization process is performed until the upper surfaces of the pillar-type channels 404A are exposed. At this time, a chemical mechanical polishing (CMP) process may be used as the planarization process.

A plurality of bit lines BL are formed on the second dielectric layer 408 so as to cross over the plurality of drain selection lines 407 while coupled to the drain selection transistors DST.

In accordance with an exemplary embodiment of the present invention, because the selection lines are formed of a low-resistance metallic layer, the signal transmission property of the selection lines may improve. Furthermore, the gate dielectric layer surrounding the is pillar-type channel is surrounded by the gate electrode formed of a silicon layer, and the selection line formed of a metallic layer surrounds the gate electrode. Therefore, it can substantially prevent a malfunction of the selection transistor which may be caused by a direct contact to the gate dielectric layer with the selection line formed of a metallic layer.

As described above, a 3D nonvolatile memory device and a method for fabricating the same in accordance with exemplary embodiments of the present invention couple a plurality of selection lines to a plurality of channel layers through a plurality of channel contacts, thereby reducing an area of a selection transistor and suppressing the occurrence of leakage current in the selection transistor.

Furthermore, a selection transistor in accordance with exemplary embodiments of the present invention is formed to have a gate all around (GAA), thereby reducing an occurrence of leakage current, compared with the flat selection transistor. In addition, an off characteristic of the selection transistor may be improved. Since the plurality of drain selection lines are formed at the same layer, the level of difficulty in the drain selection line formation process decreases.

Furthermore, a plurality of selection lines and a plurality of selection transistors are formed at the same layer, and therefore, a process for forming the selection lines and selection transistors can be simplified.

Furthermore, the selection line of exemplary embodiments of the present invention is formed of a low-resistance metallic layer in order to improve a signal transmission property of the selection line.

Furthermore, a gate electrode of exemplary embodiments of the present invention is formed of a silicon layer and is inserted between the selection line and a gate dielectric layer of the selection transistor to substantially prevent a direct contact between the selection line and the gate dielectric layer, thereby substantially preventing a malfunction of the selection transistor which may occur when the selection line is formed of a low-resistance metallic layer.

While the present invention has been described with respect to the specific embodiments, it will be apparent to those skilled in the art that various changes and modifications may be made without departing from the spirit and scope of the invention as defined in the following claims.

What is claimed is:
1. A 3D nonvolatile memory device comprising:
   a plurality of channel structures each comprising a plurality of channel layers and interlayer dielectric layers that are alternately stacked;
   a plurality of channel contacts, each coupled only to a corresponding one of the plurality of channel layers; and
   a plurality of selection lines vertically-coupled to the plurality of channel contacts and crossing over the plurality of channel structures.

2. The 3D nonvolatile memory device of claim 1, further comprising a plurality of selection transistors buried in the plurality of selection lines and coupled to the channel contacts.

3. The 3D nonvolatile memory device of claim 2, wherein the selection transistor has a gate all around (GAA) structure.

4. The 3D nonvolatile memory device of claim 2, wherein each of the selection transistors comprises a pillar-type channel coupled to a corresponding channel contact among the plurality of channel contacts.

5. The 3D nonvolatile memory device of claim 2, wherein each of the selection transistors comprises:
    a pillar-type channel coupled to a corresponding channel contact among the plurality of channel contacts;
    a gate dielectric layer surrounding the pillar-type channel; and
    a gate electrode surrounding the gate dielectric layer.

6. The 3D nonvolatile memory device of claim 2, comprising a bit line formed over the selection lines, coupled to the channel contacts through the selection transistors, and crossing over the selection lines.

7. The 3D nonvolatile memory device of claim 6, wherein the bit line extends in the same direction as the channel structure.

8. The 3D nonvolatile memory device of claim 1, wherein each of the selection lines is a drain selection line.

9. The 3D nonvolatile memory device of claim 1, wherein the selection lines are formed as a single layer and coupled to the plurality of channel contacts, respectively.

10. The 3D nonvolatile memory device of claim 1, wherein the selection lines are formed as a plurality of layers.

11. The 3D nonvolatile memory device of claim 10, wherein the selection lines comprise:
    a plurality of first selection lines coupled to one or more channel contacts, respectively; and
    a plurality of second selection lines formed over the first selection lines and coupled to the other channel contacts, respectively, wherein the first selection lines and the second selection lines does not overlap each other.

12. The 3D nonvolatile memory device of claim 10, wherein the selection lines comprise:
    a plurality of first selection lines each coupled to at least two adjacent channel contacts; and
    a plurality of second selection lines formed over the first selection lines and each coupled to at least two adjacent channel contacts, wherein the channel contacts of first selection lines are partially shared with that of the second selection lines.

13. The 3D nonvolatile memory device of claim 1, wherein the channel structure is patterned in a stepped shape to expose the plurality of channel layers.

14. The 3D nonvolatile memory device of claim 1, wherein the plurality of channel layers and interlayer dielectric layers are alternately stacked along an etched surface of a trench formed by etching a substrate to form the plurality of channel structures.

15. The 3D nonvolatile memory device of claim 1, wherein, the channel layers of the adjacent channel structures are isolated from each other, and the channel layers formed at the lowermost layer are isolated by the interlayer dielectric layer.

16. The 3D nonvolatile memory device of claim 1, wherein, the channel layers of the adjacent channel structures are isolated from each other, and the channel layers formed at the lowermost layer are isolated by the interlayer dielectric layer.

17. A method for fabricating a 3D nonvolatile memory device, the method comprising:
    forming a plurality of channel structures each comprising a plurality of channel layers and interlayer dielectric layers which are alternately stacked;
    forming a plurality of channel contacts, each coupled only to a corresponding one of the plurality of channel layers; and
    forming a plurality of selection lines vertically-coupled to the plurality of channel contacts and crossing over the plurality of channel structures.

18. The method of claim 17, wherein the forming of the plurality of channel structures comprises:
    forming a trench by etching a substrate; and
    stacking the plurality of channel layers and interlayer dielectric layers alternately along an etched surface of the trench.

19. The method of claim 18, wherein the forming of the plurality of channel structures comprises patterning the etched channel layers and interlayer dielectric layers in a stepped shape to expose the plurality of channel layers.

* * * * *

UNITED STATES PATENT AND TRADEMARK OFFICE
CERTIFICATE OF CORRECTION

PATENT NO. : 8,482,051 B2  
APPLICATION NO. : 12/974397  
DATED : July 9, 2013  
INVENTOR(S) : Se-Yun Lim et al.

Page 1 of 1

It is certified that error appears in the above-identified patent and that said Letters Patent is hereby corrected as shown below:

On the title page, item (54) and in the specification, column 1, title should read:

3D NONVOLATILE MEMORY DEVICE INCLUDING A PLURALITY OF CHANNEL CONTACTS COUPLED TO A PLURALITY OF CHANNEL LAYERS AND A PLURALITY OF SELECTION LINES COUPLED TO THE PLURALITY OF CHANNEL CONTACTS AND METHOD FOR FABRICATING THE SAME

Signed and Sealed this  
Sixth Day of August, 2013

Teresa Stanek Rea  
*Acting Director of the United States Patent and Trademark Office*